(12) United States Patent
Lee et al.

(10) Patent No.: US 9,123,406 B2
(45) Date of Patent: Sep. 1, 2015

(54) SEMICONDUCTOR MEMORY DEVICE CAPABLE OF SELECTIVELY ENABLING/DISABLING A FIRST INPUT UNIT AND A SECOND INPUT UNIT IN RESPONSE TO A FIRST AND SECOND INTERNAL CLOCK IN A GEAR-DOWN MODE

(71) Applicant: SK hynix Inc., Gyeonggi-do (KR)

(72) Inventors: Yo-Sep Lee, Gyeonggi-do (KR);
Chang-Hyun Kim, Gyeonggi-do (KR);
Choung-Ki Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/293,649

(22) Filed: Jun. 2, 2014

(65) Prior Publication Data

US 2015/0155023 A1    Jun. 4, 2015

(30) Foreign Application Priority Data

Dec. 4, 2013 (KR) .......................... 10-2013-0149724

(51) Int. Cl.
*G11C 8/18* (2006.01)
*G11C 8/08* (2006.01)
*G11C 8/06* (2006.01)
*G11C 8/10* (2006.01)

(52) U.S. Cl.
CPC .. *G11C 8/18* (2013.01); *G11C 8/06* (2013.01); *G11C 8/08* (2013.01); *G11C 8/10* (2013.01)

(58) Field of Classification Search
CPC .................................... G11C 8/18; G11C 8/06
USPC .............. 365/233.11, 233.12, 233.13, 233.1, 365/189.02, 230.02, 189.05, 194, 230.08, 365/227, 229
See application file for complete search history.

(56) References Cited

U.S. PATENT DOCUMENTS

| 6,188,640 | B1 * | 2/2001 | Aikawa et al. ............. 365/233.1 |
| 6,292,412 | B1 * | 9/2001 | Kato et al. ..................... 365/194 |
| 2002/0043996 | A1 * | 4/2002 | Iwamoto ....................... 327/158 |
| 2007/0183251 | A1 * | 8/2007 | Jang ............................. 365/233 |

FOREIGN PATENT DOCUMENTS

| KR | 1020010036041 | 5/2001 |
| KR | 1020080109199 | 12/2008 |
| KR | 1020120023308 | 3/2012 |

* cited by examiner

*Primary Examiner* — Andrew Q Tran
(74) *Attorney, Agent, or Firm* — IP & T Group LLP

(57) ABSTRACT

A semiconductor memory device includes a clock signal generation unit suitable for dividing an external clock signal to generate a first internal clock signal corresponding to odd number periods of the external clock signal and a second internal clock corresponding to even number periods, a first input unit suitable for receiving an external command signal and an external address signal in response to the first internal clock signal, a second input unit suitable for receiving the external command signal and the external address signal in response to the second internal clock signal, and an operation control unit suitable for enabling one of the first input unit and the second input unit and disabling the other of the first input unit and the second input unit, during a gear-down mode.

20 Claims, 15 Drawing Sheets

SEMICONDUCTOR MEMORY DEVICE CAPABLE OF SELECTIVELY ENABLING/DISABLING A FIRST INPUT UNIT AND A SECOND INPUT UNIT IN RESPONSE TO A FIRST AND SECOND INTERNAL CLOCK IN A GEAR-DOWN MODE

CROSS-REFERENCE TO RELATED APPLICATIONS

The present application claims priority of Korean Patent Application No. 10-2013-0149724, filed on Dec. 4, 2013, which is incorporated herein by reference in its entirety.

BACKGROUND

1. Field

Exemplary embodiments of the present invention relate to a semiconductor design technology, and more particularly, to a semiconductor memory device for performing a gear-down mode operation.

2. Description of the Related Art

A gear-down mode may be performed in a semiconductor memory device such as a double data rate 4 (DDR4) semiconductor memory device, which operates at a high speed.

The gear-mode represents an operation mode in which command and address signals are received on the basis of two periods (2tck) of an external clock signal for an operation stability of a semiconductor memory device.

For example, the DDR4 semiconductor memory device has a target operation speed of 3300 Mbps. It is difficult to satisfy a setup and hold margin between an external clock signal and the command and address signals during a high speed operation of the DDR4 semiconductor memory device and accomplish high mass production simultaneously. Thus, in the gear-down mode, the command and address signals are received on the basis of a second period (2 tck) instead of one period (1 tck) of an external clock signal, to obtain an operation stability of a semiconductor memory device. Through the gear-down mode, since a frequency of an internal clock signal is lowered to a half of a data clock signal and a pulse width is expanded, the setup and hold margin may be obtained until an operation speed of 1600 Mbps. That is, through the gear-down mode the operation stability of the semiconductor memory device which operates at a high speed, may be obtained.

A circuit which defines a timing among an internal clock signal, an external clock signal and the command and address signals must be included in a semiconductor memory device and a semiconductor system using the gear-down mode. However, since the external clock signal is a high frequency, it is difficult to coordinate the timing among the internal clock signal, the external clock signal and the command and address signals.

SUMMARY

Exemplary embodiments of the present invention are directed to a semiconductor memory device for stably operating in a gear-down mode.

In accordance with an exemplary embodiment of the present invention, a semiconductor memory device may include a clock signal generation unit suitable for dividing an external clock signal to generate a first internal clock signal corresponding to odd number periods of the external clock signal and a second internal clock corresponding to even number periods, a first input unit suitable for receiving an external command signal and an external address signal in response to the first internal clock signal, a second input unit suitable for receiving the external command signal and the external address signal in response to the second internal clock signal, and an operation control unit suitable for enabling one of the first input unit and the second input unit and disabling the other of the first input unit and the second input unit, during a gear-down mode.

The operation control unit may enable the first input unit and the second input unit during a normal operation mode.

The operation control unit may include an operation enable signal generation unit suitable for activating one of a first operation enable signal and a second operation enable signal, and inactivating the other of first operation enable signal and the second operation enable signal in response to a clock selection signal, the first internal clock signal and the second internal clock signal during the gear-down mode, a first clock selection unit suitable for fixing the first internal clock signal to a predetermined logic level in response to the first operation enable signal, and a second clock selection unit suitable for fixing the second internal clock signal to the predetermined logic level in response to the second operation enable signal.

The operation enable signal generation unit may include a first activation determination unit suitable for latching the clock selection signal based on the first internal clock signal and determining an activation state of the first operation enable signal, during the gear-down mode, and a second activation determination unit suitable for latching the clock selection signal based on the second internal clock signal and determining an activation state of the second operation enable signal, during the gear-down mode.

The clock signal generation unit may generate a third internal clock signal having a same frequency as the external clock signal during a high speed operation mode, the operation control unit may enable one of the first input unit and the second input unit, and disables the other of the first input unit and the second input unit during the high speed operation mode, and the one of the first input unit and the second input unit, which is enabled by the operation control unit during the high speed operation mode, may receive the external clock signal and the external address signal in response to a third internal clock signal.

DETAILED DESCRIPTION

Figure 1:
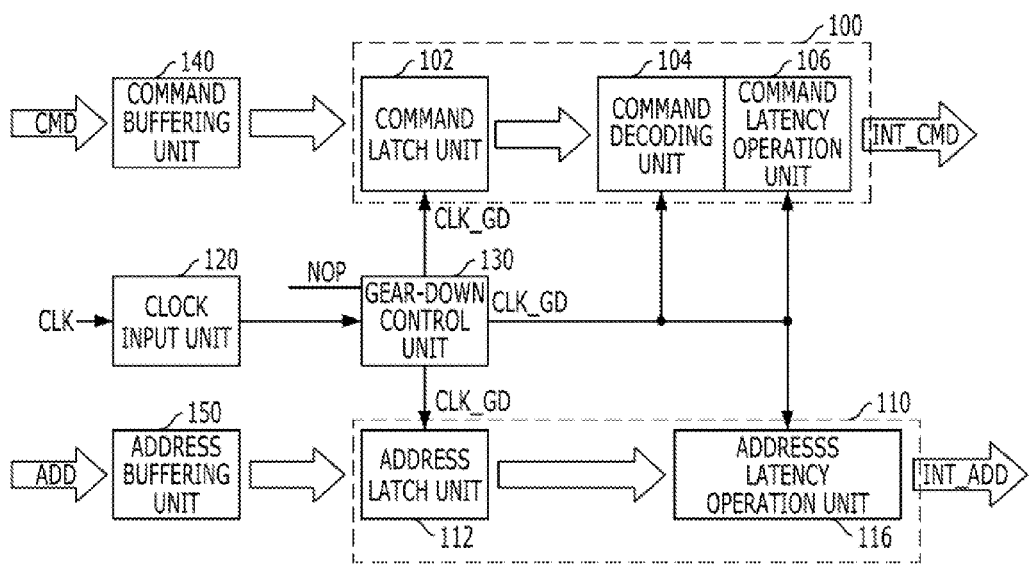
FIG. 1 is a block diagram illustrating a semiconductor memory device using a gear-down mode in accordance with a first embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like parts in the various figures and embodiments of the present invention.

The drawings are not necessarily to scale and in some instances proportions may have been exaggerated in order to clearly illustrate features of the embodiments. In this specification, specific terms have been used. The terms are used to describe the present invention, and are not used to qualify the sense or limit the scope of the present invention.

It is also noted that in this specification, "and/or" represents that one or more of components arranged before and after "and/or" is included. Furthermore, "connected/coupled" refers to one component not only directly coupling another component but also indirectly coupling another component through an intermediate component. In addition, a singular form may include a plural for as long as it is not specifically mentioned in a sentence. Furthermore, "include/comprise" or "including/comprising" used in the specification represents that one or more components, steps, operations, and elements exists or are added.

FIG. 1 is a block diagram illustrating a semiconductor memory device using a gear-down mode in accordance with a first embodiment of the present invention.

Referring to FIG. 1, a semiconductor memory device using a gear-down mode in accordance with a first embodiment of the present invention includes a command input unit 100, an address input unit 110, a clock signal input unit 120, a gear-down control unit 130, a command buffering unit 140 and an address buffering unit 150.

The command input unit 100 receives an external command signal CMD latched in the command buffering unit 140 in response to an internal clock signal CLK_GD and generates an internal command signal INT_CMD. The command input unit 100 includes a command latch unit 102, a command decoding unit 104 and a command latency operation unit 106. The command latch unit 102 latches the external command signal CMD in response to the internal clock signal CLK_GD. The command decoding unit 104 decodes the external command signal CMD, which is latched in the command latch unit 102, and determines a sort of the external command signal CMD. The command latency operation unit 106 determines a number of togglings (i.e. count of how many togglings) of the internal clock signal CLK_GD for indicating a latency delay and generates the internal command signal INT_CMD.

The address input unit 110 receives an external address signal ADD latched in the address buffering unit 150 in response to the internal clock signal CLK_GD and generates an internal address signal INT_ADD. The address input unit 110 includes an address latch unit 112 and an address latency operation unit 116. The address latch unit 112 latches the external address signal ADD in response to the internal clock signal CLK_GD. The address latency operation unit 116 generates the internal address signal INT_ADD by delaying the external address signal ADD latched in the address latch unit 112 by the number of toggling of the internal clock signal CLK_GD.

The clock signal input unit 120 buffers an external clock signal CLK received from the external device (not shown) and transfers the external clock signal CLK to the gear-down control unit 130.

The gear-down control unit 130 outputs the external clock signal CLK, which is received from the clock signal input unit 120, as the internal clock signal CLK_GD. The gear-down control unit 130 determines whether the internal clock signal CLK_GD having a same frequency as the external clock signal is generated or the internal clock signal CLK_GD having a half frequency of the external clock signal CLK is generated.

The command buffering unit 140 buffers and transmits the external command signal CMD to the command input unit 100. The address buffering unit 150 buffers and transmits the external address signal ADD to the address input unit 110.

Figure 5A:
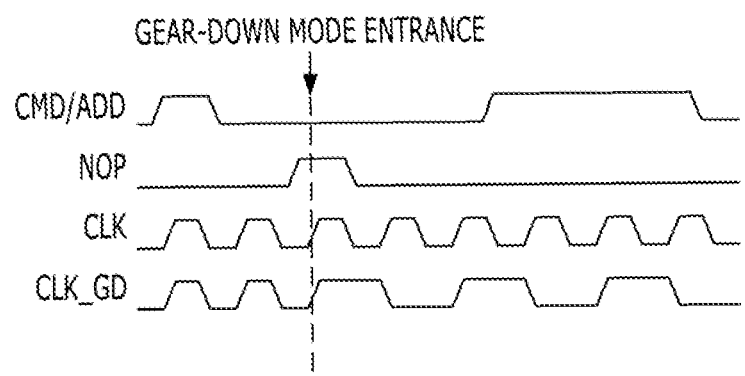
FIG. 5A is a timing diagram illustrating an operation of the semiconductor memory device using the gear-down mode shown in FIG. 1.

FIG. 5A is a timing diagram illustrating an operation of the semiconductor memory device using the gear-down mode shown in FIG. 1.

Referring to FIG. 5A, an operation of the semiconductor memory device using the gear-down made in accordance with the first embodiment of the present invention will be described below.

If the gear-down mode is entered, the external command signal CMD and the external address signal ADD are received in response to the internal clock signal CLK_GD having the half frequency of the external clock signal CLK. Thus, the external command signal CMD and the external address signal ADD may be received at every two periods (2tck) of the external clock signal CLK. During the gear-down mode, the external device (not shown), e.g., a semiconductor memory controller transmits the external command signal CMD and the external address signal ADD to the semiconductor memory device on the basis of the two periods (2tck) of the external clock signal CLK.

If the gear-down mode is not entered, that is, during a normal operation mode, the external command signal CMD and the external address signal ADD are received in response to the internal clock signal CLK_GD having a same frequency as the external clock signal. Thus, the external command signal CMD and the external address signal ADD may be received at every one period (1tck) of the external clock signal CLK. During the normal operation mode, the external device (not shown), e.g., the semiconductor memory controller, transmits the external command signal CMD and the external address signal ADD to the semiconductor memory device on the basis of the one period (1 tck) of the external clock signal CLK.

As described above, the semiconductor memory device using the gear-down mode in accordance with the first embodiment of the present invention may operate stably during the gear-down mode by properly adjusting a frequency relation between the external clock signal CLK and the internal clock signal CLK_GD when entering the gear-down mode.

However, since the frequency of the internal clock signal CLK_GD is changed when the gear-down mode is entered or the gear-down mode exits, an internal circuit of the semiconductor memory device using the gear-down mode in accordance with the first embodiment of the present invention must be designed to operate normally at both frequencies. Specifically, when the gear-down mode is entered, the one period (1tck) of the internal clock signal CLK_GD corresponds to the two periods (2tck) of the external clock signal CLK, and during the normal operation mode the one period (1tck) of the internal clock signal CLK_GD corresponds to the one period (1tck) of the external clock signal CLK. If a frequency matching between the internal clock signal CLK_GD and the external clock signal CLK is changed according to an operation mode, internal circuits of the semiconductor memory device such as a latency delay control circuit depending on the frequency of the internal clock signal CLK_GD, must be designed to operate differently according to a frequency change.

Figure 2:
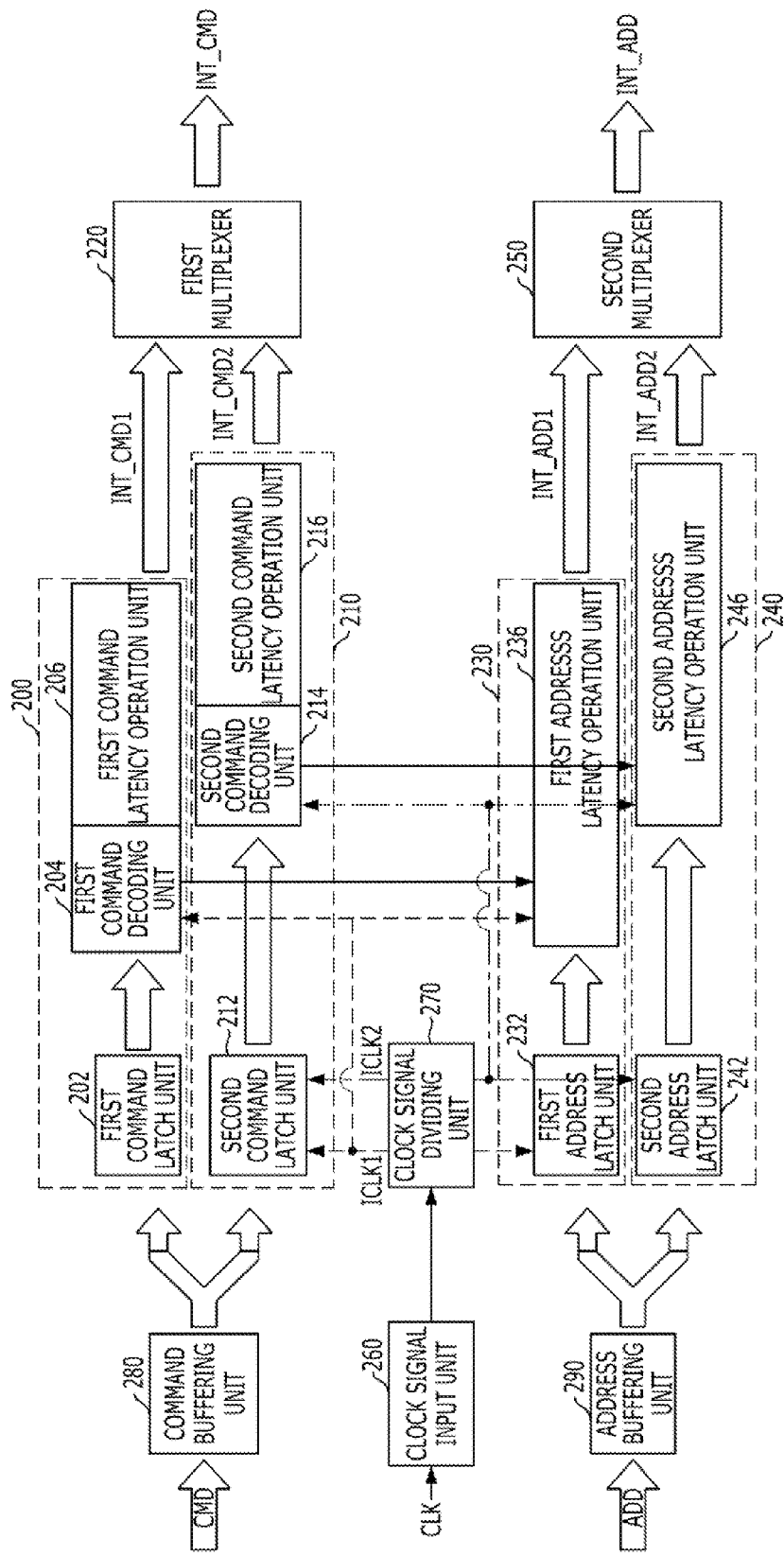
FIG. 2 is a block diagram illustrating a semiconductor memory device using a gear-down mode in accordance with a second embodiment of the present invention.

FIG. 2 is a block diagram illustrating a semiconductor memory device using a gear-down mode in accordance with a second embodiment of the present invention.

Referring to FIG. 2, a semiconductor memory device using a gear-down mode in accordance with a second embodiment of the present invention includes a first command input unit 200, a second command input unit 210, a first multiplexer 220, a first address input unit 230, a second address input unit 240, a second multiplexer 250, a clock signal input unit 260, a clock signal dividing unit 270, a command buffering unit 280 and an address buffering unit 290.

The first command input unit 200 receives an external command signal CMD latched in the command buffering unit 280 in response to a first internal clock signal ICLK1 and generates a first internal command signal INT_CMD1. The first command input unit 200 includes a first command latch unit 202, a first command decoding unit 204 and a first command latency operation unit 206. The first command latch unit 202 latches the external command signal CMD in response to the first internal clock signal ICLK1. The first command decoding unit 204 decodes the external command signal CMD, which is latched in the first command latch unit 202, and determines a sort of the external command signal CMD. The first command latency operation unit 206 determines the number of toggling of the first internal clock signal ICLK1 for indicating a first latency delay, and generates the first internal command signal INT_CMD1.

The second command input unit 210 receives the external command signal CMD latched in the command buffering unit 280 in response to a second internal clock signal ICLK2 and generates a second internal command signal INT_CMD2. The second command input unit 210 includes a second command latch unit 212, a second command decoding unit 214 and a second command latency operation unit 206. The second command latch unit 212 latches the external command signal CMD in response to the second internal clock signal ICLK2. The second command decoding unit 214 decodes the external command signal CMD, which is latched in the second command latch unit 212, and determines a sort of the external command signal CMD. The second command latency operation unit 216 determines the number of toggling of the second internal clock signal ICLK2 for indicating a second latency delay, and generates the second internal command signal INT_CMD2.

The first multiplexer 220 receives the first internal command signal INT_CMD1 and the second internal command signal INT_CMD2, and outputs selectively the internal command signal INT_CMD as the first internal command signal INT_CMD1 or the second internal command signal INT_CMD2.

The first address input unit 230 receives an external address signal ADD latched in the address buffering unit 290 in response to the first internal clock signal ICLK1 and generates a first internal address signal INT_ADD1. The first address input unit 230 includes a first address latch unit 232 and a first address latency operation unit 236. The first address latch unit 232 latches the external address signal ADD in response to the first internal clock signal ICLK1. The first address latency operation unit 236 generates the first internal address signal INT_ADD1 by delaying the external address signal ADD latched in the first address latch unit 232 by the number of toggling of the first internal clock signal ICLK1.

The second address input unit 240 receives the external address signal ADD latched in the address buffering unit 290 in response to the second internal clock signal ICLK2 and generates a second internal address signal INT_ADD2. The second address input unit 240 includes a second address latch unit 242 and a second address latency operation unit 246. The second address latch unit 242 latches the external address signal ADD in response to the second internal clock signal ICLK2. The second address latency operation unit 246 generates the second internal address signal INT_ADD2 by delaying the external address signal ADD latched in the second address latch unit 242 by the number of toggling of the second internal clock signal ICLK2.

The second multiplexer 250 receives the first internal address signal INT_ADD1 and the second internal address signal INT_ADD2, and outputs selectively the internal address signal INT_ADD as the first internal address signal INT_ADD1 or the second internal address signal INT_ADD2.

The clock signal input unit 260 buffers an external clock signal CLK received from the external device (not shown), e.g., a semiconductor memory controller, and transfers the external clock signal CLK to the clock signal dividing unit 270.

The clock signal dividing unit 270 divides a frequency of the external clock signal CLK, which is received from the clock signal input unit 260, into a half frequency of the external clock signal CLK. The clock signal dividing unit 270 generates the first internal clock signal ICLK1, which is synchronized with an odd number of toggling of the external clock signal CLK, and the second internal clock signal ICLK2, which is synchronized with an even number of toggling of the external clock signal CLK.

The command buffering unit 280 buffers and transmits the external command signal CMD to the first command input unit 200 and the second command input unit 210. The address buffering unit 290 buffers and transmits the external address signal ADD to the first address input unit 230 and the second address input unit 240.

Figure 5B:
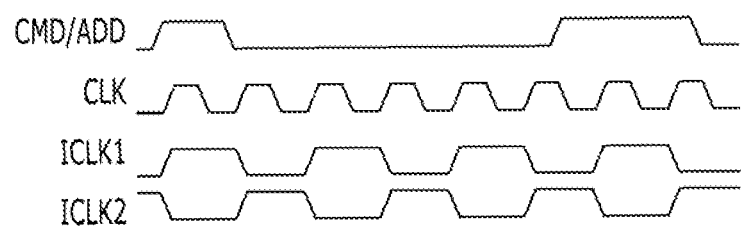
FIG. 5B is a timing diagram illustrating an operation of the semiconductor memory device using the gear-down mode shown in FIG. 2.

FIG. 5B is a timing diagram illustrating an operation of the semiconductor memory device using the gear-down mode shown in FIG. 2.

Referring to FIG. 5B, the semiconductor memory device using the gear-down mode in accordance with the second embodiment of the present invention processes the external command signal CMD and the external address signal ADD through two paths irrespective of the entrance of the gear-down mode. That is, if the external command signal CMD and the external address signal ADD are synchronized and inputted at the odd number of toggling of the external clock signal CLK, the internal command signal INT_CMD and the internal address signal INT_ADD are outputted through the first command input unit 200 and the first address input unit 230. If the external command signal CMD and the external address signal ADD are synchronized and inputted at the even number of toggling of the external clock signal CLK, the internal command signal INT_CMD and the internal address signal INT_ADD are outputted through the second command input unit 210 and the second address input unit 240.

Thus, when the gear-down mode is entered and the external command signal CMD and the external address signal ADD are inputted on the basis of two periods (2tck), the internal command signal INT_CMD and the internal address signal INT_ADD may be outputted through the first command input unit 200 and the first address input unit 230, or through the second command input unit 210 and the second address input unit 240.

Moreover, when a normal operation mode is entered and the external command signal CMD and the external address signal ADD are inputted on the basis of one period (1tck) of the external clock signal CLK, the internal command signal INT_CMD and the internal address signal INT_ADD may be outputted through all of the first command input unit 200, the second command input unit 210, the first address input unit 230 and the second address input unit 240.

As described above, the semiconductor memory device using the gear-down mode in accordance with the second embodiment of the present invention may receive stably the external command signal CMD and the external address signal ADD irrespective of the normal operation mode or the gear-down mode by using a first path having the first command input unit 200 and the first address input unit 230 and a second path having the second command input unit 210 and the second address input unit 240.

However, the semiconductor memory device using the gear-down mode in accordance with the second embodiment of the present invention occupies more area than the semiconductor memory device using the gear-down mode in accordance with the first embodiment of the present invention since the first and second command input units 200 and 230 for generating the internal command signal INT_CMD and the first and second address input units 210 and 240 for generating the internal address signal INT_ADD are used. Moreover, since the external command signal CMD and the external address signal ADD are received on the basis of the odd or even number of toggling of the external clock signal CLK during the gear-down mode, unused elements may consume an unnecessary current. For example, if the external command signal CMD and the external address signal ADD are received on the basis of the odd number of toggling of the external clock signal CLK during the gear-down mode, the second command input unit 210 and the second address input unit 240 for receiving the external command signal CMD and the external address signal ADD on the basis of the even number of toggling of the external clock signal CLK do not perform any operation, but consume an unnecessary current.

Figure 3:
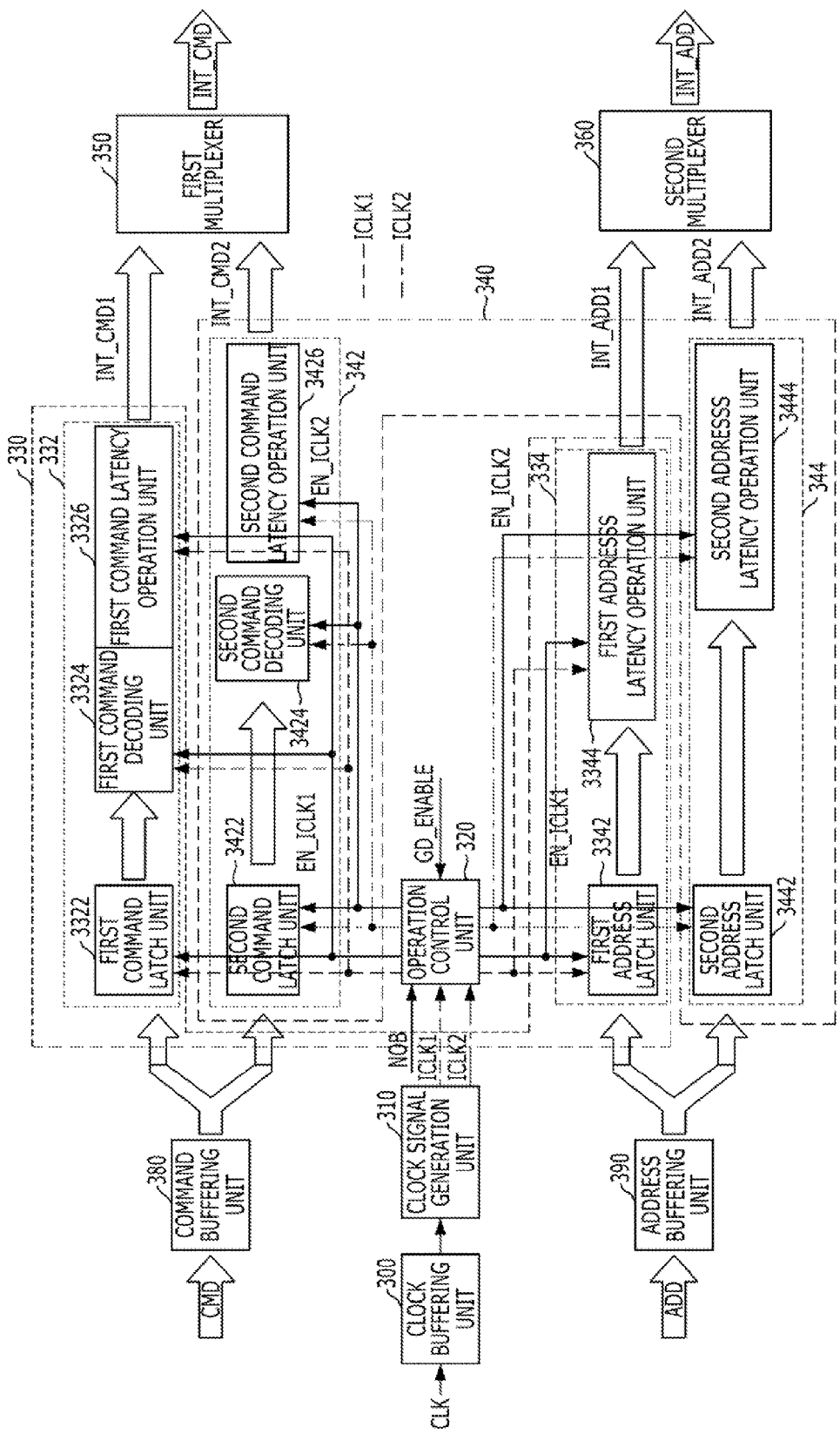
FIG. 3 is a block diagram illustrating a semiconductor memory device using a gear-down mode in accordance with a third embodiment of the present invention.

FIG. 3 is a block diagram illustrating a semiconductor memory device using a gear-down mode in accordance with a third embodiment of the present invention.

Referring to FIG. 3, a semiconductor memory device using a gear-down mode in accordance with a third embodiment of the present invention combines the merits of the semiconductor memory device using the gear-down mode in accordance with the first embodiment of the present invention and the merits of the semiconductor memory device using the gear-down mode in accordance with the second embodiment of the present invention.

Specifically, the semiconductor memory device using the gear-down mode in accordance with the third embodiment of the present invention includes a clock buffering unit 300, a clock signal generation unit 310, an operation control unit 320, a first input unit 330, a first multiplexer 350, a second input unit 340, a second multiplexer 360, a command buffering unit 380 and an address buffering unit 390.

The clock buffering unit 300 buffers an external clock signal CLK received from the external device (not shown), e.g., a semiconductor memory controller, and transfers an external clock signal CLK to the clock signal generation unit 310.

The clock signal generation unit 310 divides a frequency of the external clock signal CLK into a half frequency of an external clock signal CLK, and generates a first internal clock signal ICLK1 corresponding to an odd number of periods of the external clock signal CLK and a second internal clock signal ICLK2 corresponding to an even number of periods of the external clock signal CLK.

The operation control unit 315 generates and transmits a first operation enable signal EN_ICLK1 for enabling the first input unit 330 and a second operation enable signal EN_ICLK2 for enabling the second input unit 340 to the first input unit 330 and the second input unit 340 in response to a gear-down enable signal GD_ENABLE. The operation control unit 320 enables one of the first input unit 330 and the second input unit 340 and disables the other of the first input unit 330 and the second input unit 340 during the gear-down mode. The operation control unit 320 enables the first input unit 330 and the second input unit 340 during the normal operation mode.

The gear-down mode represents a period that a gear-down mode is activated. That is, if the gear-down mode enable signal is activated through the mode register set ("MRS") or a predetermined pad, the semiconductor memory device performs the gear-down mode.

Since the external command signal CMD and the external address signal ADD are received at every two periods (2tck) of the external clock signal CLK during the gear-down mode, one of the first input unit 330 and the second input unit 340, operates. Thus, since the other of the first input unit 330 and the second input unit 340 does not operate, a current consumption is prevented.

The normal operation mode represents that normal data of the semiconductor memory device is inputted or outputted. Since the external command signal CMD and the external address signal ADD are received at every one period (1tck) of the external clock signal CLK during the normal operation mode, the first input unit 330 and the second input unit 340 must operate. Thus, the operation control unit 315 enables both, the first input unit 330 and the second input unit 340.

The first input unit 330 receives an external command signal CMD and an external address signal ADD and generates a first internal command signal INT_CMD1 and a first internal address signal INT_ADD1 in response to the first internal clock signal ICLK1. The first input unit 330 includes a first command input unit 332 and a first address input unit 334.

The first command input unit 332 receives an external command signal CMD and generates the first internal command signal INT_CMD1 in response to the first internal clock signal ICLK1. The first command input unit 332 includes a first command latch unit 3322, a first decoding unit 3324 and a first command latency operation unit 3325.

The first command latch unit 3322 latches the external command signal CMD in response to the first internal clock signal ICLK1. The first command decoding unit 3324 decodes the external command signal CMD latched in the first command latch unit 3322, and determines a sort of the external command signal CMD. The first command decoding unit 3324 determines the number of toggling of the first internal clock signal ICLK1 for indicating a latency delay according to the sort of the external command signal CMD. Herein, the latency delay is variable according to the sort of the external command signal CMD. The first command input unit 332 operates in a first internal clock signal domain region. Thus, the external command signal CMD latched in the first command latch unit 3322 is outputted as the first internal command signal INT_CMD1 by delaying the external command signal CMD by the latency delay. The first command decoding unit 3324 determines the sort of the external command signal CMD and the number of toggling of the first internal clock signal ICLK1 corresponding to the latency delay. For reference, the number of the toggling of the first internal clock signal ICLK1 is predetermined and stored in a mode register set (MRS) according to the sort of the external command signal CMD. Thus, if the sort of the external command signal CMD is determined in the first command decoding unit 3324, the number of the toggling of the first internal clock signal ICLK1 may be determined.

The first command latency operation unit 3326 delays the external command signal CMD latched in the first command latch unit 3322 by the number of toggling of the first internal clock signal ICLK1 corresponding to the latency delay determined in the first command decoding unit 3324, and outputs the first internal command signal INT_CMD1.

The first address input unit 334 receives the external address signal ADD and generates the first internal address INT_ADD1 in response to the first internal clock signal ICLK1. The first address input unit 334 includes a first address latch unit 3342 and a first address latency operation unit 3344. The first address latch unit 3342 latches the external address signal ADD in response to the first internal clock signal ICLK1. The first address latency operation unit 3344 delays the external address signal ADD latched in the first address latch unit 3342 by the number of toggling of the first internal clock signal ICLK1 corresponding to the latency delay determined in the first command decoding unit 3324, and outputs the first internal address signal INT_ADD1.

The second input unit 340 receives the external command signal CMD and the external address signal ADD, and generates a second internal command signal INT_CMD2 and a second internal address signal INT_ADD2 in response to the second internal clock signal ICLK2. The second input unit 340 includes a second command input unit 342 and a second address input unit 344.

The second command input unit 342 receives the external command signal CMD and generates a second internal command signal INT_CMD2 in response to the second internal clock signal ICLK2. The second command input unit 342 includes a second command latch unit 3422 a second decoding unit 3424 and a second command latency operation unit 3426.

The second command input unit 3422 latches the external command signal CMD in response to the second internal clock signal ICLK2. The second command decoding unit 3424 decodes the external command signal CMD latched in the second command latch unit 3422, and determines a sort of the external command signal CMD. The second command decoding unit 3424 determines the number of toggling of the second internal clock signal ICLK2 for indicating a latency delay according to the sort of the external command signal CMD. The latency delay is variable according to the sort of the external command signal CMD. The second command input unit 342 operates in a second internal clock signal domain region. Thus, the external command signal CMD latched in the second command latch unit 3422 is outputted as the second internal command signal INT_CMD2 by delaying the external command signal CMD by the latency delay. The second command decoding unit 3424 determines the sort of the external command signal CMD and the number of toggling of the second internal clock signal ICLK2 corresponding to the latency delay. For reference, the number of toggling of the second internal clock signal ICLK2 is predetermined and stored in the mode register set (MRS) according to the sort of the external command signal CMD. Thus, if the sort of the external command signal CMD is determined in the second command decoding unit 3424, the number of toggling of the second internal clock signal ICLK2 may be determined.

The second command latency operation unit 3426 delays the external command signal CMD latched in the second command latch unit 3422 by the number of toggling of the second internal clock signal ICLK2 corresponding to the latency delay determined in the second command decoding unit 3424, and outputs the second internal command signal INT_CMD2.

The second address input unit 344 receives the external address signal ADD and generates the second internal address INT_ADD2 in response to the second internal clock signal ICLK2. The second address input unit 344 includes a second address latch unit 3442 and a second address latency operation unit 3444. The second address latch unit 3442 latches the external address signal ADD in response to the second internal clock signal ICLK2. The second address latency operation unit 3444 delays the external address signal ADD latched in the second address latch unit 3442 by the number of toggling of the second internal clock signal ICLK2 corresponding to the latency delay determined in the second command decoding unit 3424, and outputs the second internal address signal INT_ADD2.

The first multiplexer 350 receives the first internal command signal INT_CMD1 and the second internal command signal INT_CMD2, and outputs selectively the internal command signal INT_CMD as the first internal command signal INT_CMD1 or the second internal command signal INT_CMD2.

The second multiplexer 360 receives the first internal address signal INT_ADD1 and the second internal address signal INT_ADD2, and outputs selectively the internal address signal INT_ADD as the first internal address signal INT_ADD1 or the second internal address signal INT_ADD2.

The command buffering unit 380 buffers and transmits the external command signal CMD to the first command input unit 332 of the first input unit 330 and the second command input unit 342 of the second input unit 340. The address buffering unit 390 buffers and transmits the external address signal ADD to the first address input unit 334 of the first input unit 330 and the second address input unit 344 of the second input unit 340.

Figure 4A:
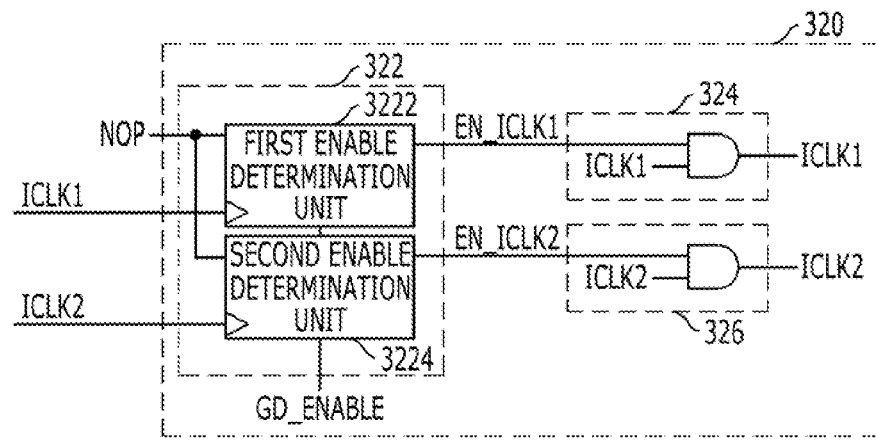
FIG. 4A is a block diagram illustrating an operation control unit of the semiconductor memory device using the gear-down mode shown in FIG. 3.

FIG. 4A is a block diagram illustrating an operation control unit of the semiconductor memory device using the gear-down mode shown in FIG. 3.

Referring to FIG. 4A, the operation control unit 320 of the semiconductor memory device using the gear-down mode shown in FIG. 3 includes an operation enable signal generation unit 322, a first clock selection unit 324 and a second clock selection unit 326.

The operation enable signal generation unit 322 activates one of the first operation enable signal EN_ICLK1 and the second enable signal EN_ICLK2, and inactivates the other of the first operation enable signal EN_ICLK1 and the second enable signal EN_ICLK2 in response to the first internal clock signal ICLK1, the second internal clock signal, and a clock selection signal NOP during the gear-down mode. The operation enable signal generation unit 322 includes a first enable determination unit 3222 and a second enable determination unit 3224.

During the gear-down mode, the first enable determination unit 3222 latches the clock selection signal NOP in response to the first internal clock signal ICLK1 and determines an activation stage of the first operation enable signal EN_ICLK1.

During the gear-down mode, the second enable determination unit 3224 latches the clock selection signal NOP in response to the second internal clock signal ICLK2 and determines an activation stage of the second operation enable signal EN_ICLK2.

The clock selection signal NOP is a signal for indicating an input timing of the external command signal CMD and the external address signal ADD during the gear-down mode. That is, the activation period of the clock selection signal NOP is the same as the activation period of the external command signal CMD and the external address signal ADD. For reference, the activation timing and the activation period of the clock selection signal NOP may be determined through the MRS or a predetermined pad. Thus, if the activation period of the clock selection signal NOP is detected by using the first internal clock signal ICLK1, the activation period of the clock selection signal NOP is not detected by using the second internal clock signal ICLK2. This represents that the external command signal CMD and the external address signal ADD are inputted corresponding to the odd period of the external clock signal CLK. Alternatively, if the activation period of the clock selection signal NOP is detected by using the second internal clock signal ICLK2, the activation period of the clock selection signal NOP is not detected by using the first internal clock signal ICLK1. This represents that the external command signal CMD and the external address signal ADD are inputted corresponding to the even period of the external clock signal CLK.

The operation enable signal generation unit 322 detects the clock selection signal NOP on the basis of the first internal clock signal ICLK1 and the second internal clock signal ICLK2 in response to the activation of the gear-down mode enable signal GD_ENABLE. During the activation state of the gear-down mode enable signal GD_ENABLE, if the clock selection signal NOP is detected by the first internal clock signal ICLK1, the first operation enable signal EN_ICLK1 is activated, and if the clock selection signal NOP is detected by the second internal clock signal ICLK2, the second operation enable signal EN_ICLK2 is activated. Moreover, both of the first operation enable signal EN_ICLK1 and the second operation enable signal EN_ICLK2 may not be activated at the same time during the activation state of the gear-down mode enable signal GD_ENABLE. The operation enable signal generation unit 322 maintains the activation state of the first operation enable signal EN_ICLK1 and the second operation enable signal EN_ICLK2 during the inactivation state of the gear-down mode enable signal GD_ENABLE, that is, the normal operation mode.

Figure 4B:
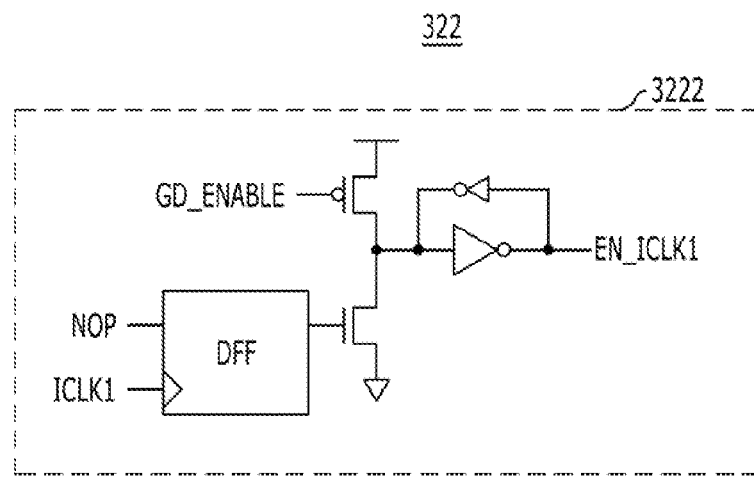
FIG. 4B is a block diagram illustrating an operation enable signal generation unit of the operation control unit shown in FIG. 4A.
Figure 4B:
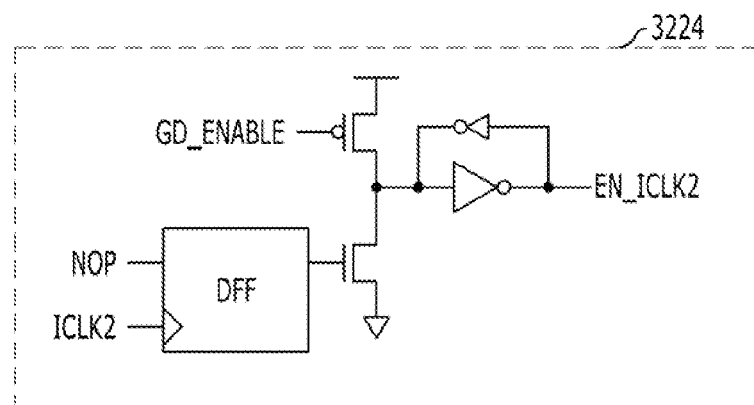

FIG. 4B is a block diagram illustrating an operation enable signal generation unit of the operation control unit shown in FIG. 4A.

Referring to FIG. 4B, during the activation state of the gear-down mode enable signal GD_ENABLE, when the clock selection signal NOP is latched and activated in response to the first internal clock ICLK1, the first enable determination unit 3222 activates the first operation enable signal EN_ICLK1. Alternatively, during the activation state of the gear-down mode enable signal GD_ENABLE, when the clock selection signal NOP is latched and inactivated in response to the first internal clock ICLK1, the first enable determination unit 3222 inactivates the first operation enable signal EN_ICLK1. When the gear-down mode enable signal GD_ENABLE is inactivated, that is, during the normal operation mode, the first enable determination unit 3222 maintains the activation state of the first operation enable signal EN_ICLK1.

During the activation state of the gear-down mode enable signal GD_ENABLE, when the clock selection signal NOP is latched and activated in response to the second internal clock ICLK2, the second enable determination unit 3224 activates the second operation enable signal EN_ICLK2. During the activation state of the gear-down mode enable signal GD_ENABLE, when the clock selection signal NOP is latched and inactivated in response to the second internal clock ICLK2, the second enable determination unit 3224 inactivates the second operation enable signal EN_ICLK2. When the gear-down mode enable signal GD_ENABLE is inactivated, that is, during the normal operation mode, the second enable determination unit 3224 maintains the activation state of the second operation enable signal EN_ICLK2.

The first clock selection unit 324 fixes selectively the first internal clock ICLK1 to a predetermined logic level in response to the first operation enable signal EN_ICLK1. That is, the first clock selection unit 324 controls the first internal clock ICLK1 to be toggled during the activation state of the first operation enable signal EN_ICLK1. The first clock selection unit 324 controls the first internal clock ICLK1 to be fixed to the predetermined logic level.

The second clock selection unit 325 fixes selectively the second internal clock ICLK2 to a predetermined logic level in response to the second operation enable signal EN_ICLK2. That is, the second clock selection unit 326 controls the second internal clock ICLK2 to be toggled during the activation state of the second operation enable signal EN_ICLK2. The second clock selection unit 326 controls the second internal clock ICLK2 to be fixed to the predetermined logic level.

Referring to FIGS. 3 and 4A, the first operation enable signal EN_ICLK1 is provided to the first input unit 330, and the first input unit 320 operates in response to the first operation enable signal EN_ICLK1. The second operation enable signal EN_ICLK2 is provided to the second input unit 340, and the second input unit 340 operates in response to the second operation enable signal EN_ICLK2.

Specifically, the first input unit 330 receives the external command signal CMD and the external address signal ADD, and outputs the first internal command signal INT_CMD1 and the first internal address signal INT_ADD1 in response to the first internal clock signal ICLK1 during the activation period of the first operation enable signal EN_ICLK1. The first input unit 330 does not perform any operation during the inactivation period of the first operation enable signal EN_ICLK1.

As described in the operation control unit 320, when the first internal clock signal ICLK1 is toggled, the first operation enable signal EN_ICLK1 is activated. When the first internal clock signal ICLK1 is fixed to the predetermined logic level, the first operation enable signal EN_ICLK1 is inactivated. Thus, if the first operation enable signal EN_ICLK1 is activated, the first input unit 330 is enabled and operates irrespective of the gear-down mode or the normal operation mode. If the first operation enable signal EN_ICLK1 is inactivated, the first input unit 330 is disabled and does not operate.

The first operation enable signal EN_ICLK1 is provided to the first command latch unit 3322, the first command decoding unit 3324 and the first command latency operation unit 3326 of the first command input unit 332, the first address latch unit 3342 and the first address latency operation unit 3344 of the first address input unit 330. Thus, if the first operation enable signal EN_ICLK1 is inactivated, the first command latch unit 3322, the first command decoding unit 3324, the first command latency operation unit 3326, the first address latch unit 3342 and the first address latency operation unit 3344 included in the first input unit 330 are disabled and do not consume a current.

The second input unit 340 receives the external command signal CMD and the external address signal ADD, and outputs the second internal command signal INT_CMD2 and the second internal address signal INT_ADD2 in response to the second internal clock signal ICLK2 during the activation period of the second operation enable signal EN_ICLK2. The second input unit 340 does not perform any operation during the inactivation period of the second operation enable signal EN_ICLK2.

As described in the operation control unit 320, when the second internal clock signal ICLK2 is toggled, the second operation enable signal EN_ICLK2 is activated. When the second internal clock signal ICLK2 is fixed to the predetermined logic level, the second operation enable signal EN_ICLK2 is inactivated. Thus, if the second operation enable signal EN_ICLK2 is activated, the second input unit 340 is enabled and operates irrespective of the gear-down mode or the normal operation mode. If the second operation enable signal EN_ICLK2 is inactivated, the second input unit 340 is disabled and does not operate.

The second operation enable signal EN_ICLK2 is provided to the second command latch unit 3422, the second command decoding unit 3424 and the second command latency operation unit 3426 of the second command input unit 342, the second address latch unit 3442 and the second address latency operation unit 3444 of the second address input unit 340. Thus, if the second operation enable signal EN_ICLK2 is inactivated, the second command latch unit 3422, the second command decoding unit 3424, the second command latency operation unit 3426, the second address latch unit 3442 and the second address latency operation unit 3444 included in the second input unit 340 are disabled and do not consume a current.

Figure 5C:
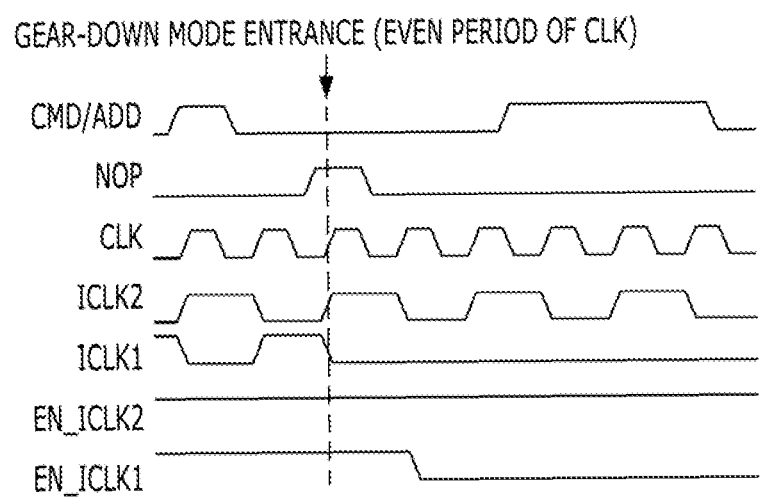
FIG. 5C is a timing diagram illustrating an operation of the semiconductor memory device using the gear-down mode shown in FIG. 3.
Figure 5C:
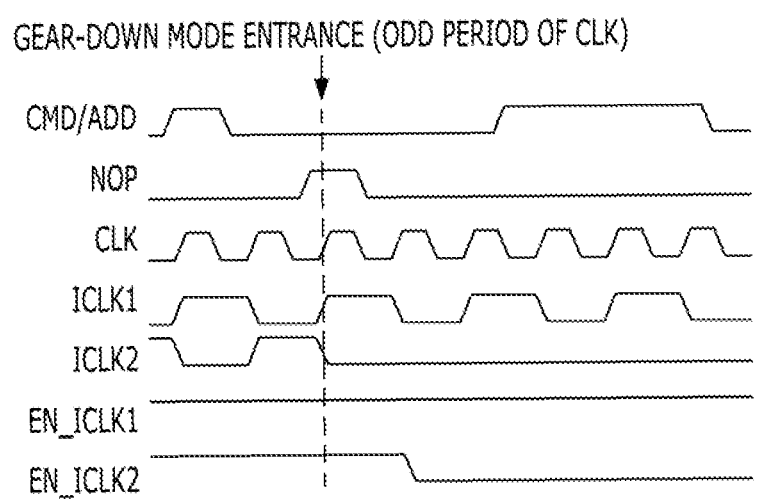

FIG. 5C is a timing diagram illustrating an operation of the semiconductor memory device using the gear-down mode shown in FIG. 3.

Referring to FIGS. 3 and 5C, an operation of the semiconductor memory device using the gear-down mode shown in FIG. 3 will be described below.

The external command signal CMD and the external address signal ADD are processed through a first path using the first input unit 330 and a second path using the second input unit 340. One of the first input unit 330 and the second input unit 340 is enabled and the other of them is disabled during the gear-down mode. That is, if the external command signal CMD and the external address signal ADD are synchronized and inputted at an odd number of toggling of the external clock signal CLK, the first internal command signal INT_CMD1 and the first internal address signal INT_ADD1 are outputted from the first input unit 330. If the external command signal CMD and the external address signal ADD are synchronized and inputted at an even number of toggling of the external clock signal CLK, the second internal command signal INT_CMD2 and the second internal address signal INT_ADD2 are outputted from the second input unit 340. The first internal command signal INT_CMD1 and the second internal command signal INT_CMD2 are selectively outputted as the internal command signal INT_CMD through the first multiplexer 350. The first internal address signal INT_ADD1 and the second internal address signal INT_ADD2 are selectively outputted as the internal address signal INT_ADD through the second multiplexer 360.

Thus, when the external command signal CMD and the external address signal ADD are inputted on the basis of the one period (1tck) of the external clock signal CLK during the normal operation mode, the first input unit 330 and the second input unit 340 are enabled, and the internal command signal INT_CMD and the internal address signal INT_ADD may be outputted through the first input unit 330 and the second input unit 340.

When the external command signal CMD and the external address signal ADD are inputted on the basis of the two periods (2tck) of the external clock signal CLK during the gear-down mode, the internal command signal INT_CMD and the internal address signal INT_ADD may be outputted through the first input unit 330 or the second input unit 340. If the external command signal CMD and the external address signal ADD are outputted as the internal command INT_CMD and the internal address signal INT_ADD through the first input unit 330, the second input unit 340 is disabled and does not perform any operation. For this operation, the first internal clock ICLK1 is toggled and the first operation enable signal EN_ICLK1 is activated by detecting the external command signal CMD and the external address signal ADD at the odd number of period of the external clock signal CLK. At the same time, the second internal clock ICLK2 is fixed to the predetermined logic level, and the second operation enable signal EN_ICLK2 is inactivated. Thus, the first input unit 330 is enabled and operates normally, and the second input unit 340 is disabled and does not operate normally.

If the external command signal CMD and the external address signal ADD are outputted as the internal command INT_CMD and the internal address signal INT_ADD through the second input unit 340, the first input unit 330 is disabled and does not perform any operation. For this operation, the second internal clock ICLK2 is toggled and the second operation enable signal EN_ICLK2 is activated by detecting the external command signal CMD and the external address signal ADD at the even number of period of the external clock signal CLK. At the same time, the first internal clock ICLK1 is fixed to the predetermined logic level, and the first operation enable signal EN_ICLK1 is inactivated. Thus, the second input unit 340 is enabled and operates normally, and the first input unit 330 is disabled and does not operate normally.

As described above, the semiconductor memory device using the gear-down mode in accordance with the third embodiment of the present invention outputs the internal command signal INT_CMD and the internal address signal INT_ADD through two paths corresponding to the first input unit 330 and the second input unit 342 at the odd number of the toggling of the external clock signal CLK and the even number of the toggling of the external clock signal CLK, respectively. Thus, the semiconductor memory device using the gear-down mode in accordance with the third embodiment of the present invention may receive the external command signal CMD and the external address signal ADD stably irrespective of the gear-down mode or the normal operation mode.

Moreover, the semiconductor memory device using the gear-down mode in accordance with the third embodiment of the present invention may prevent an unnecessary current consumption by selectively enabling one of the two paths including the first input unit 330 and the second input unit 340, and disabling the other of them.

Figure 6A:
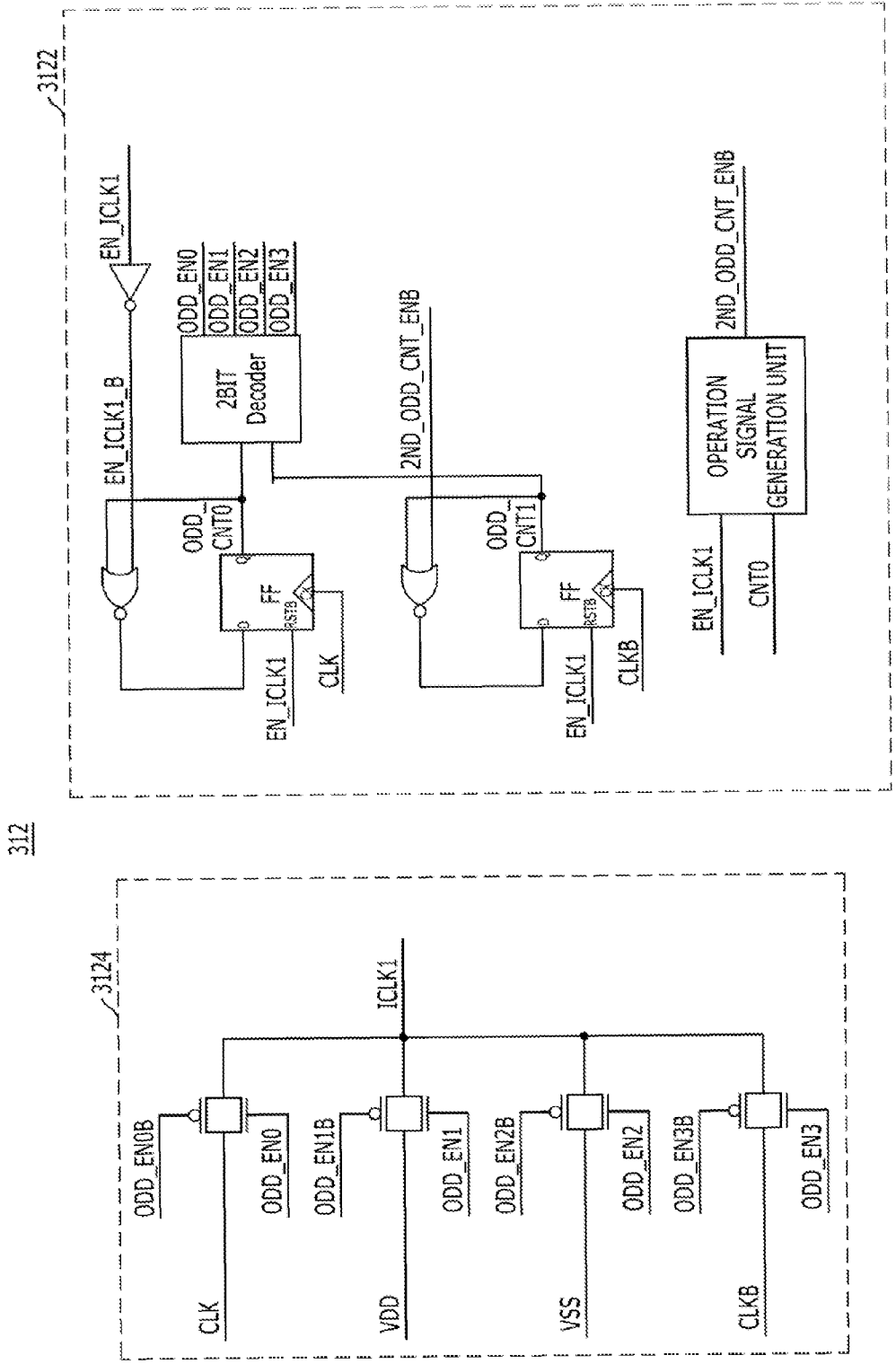
FIG. 6A is a circuit diagram illustrating a first internal clock signal generation unit in accordance with an exemplary embodiment of a clock signal generation unit of the semiconductor memory device using the gear-down mode shown in FIG. 3.
Figure 6B:
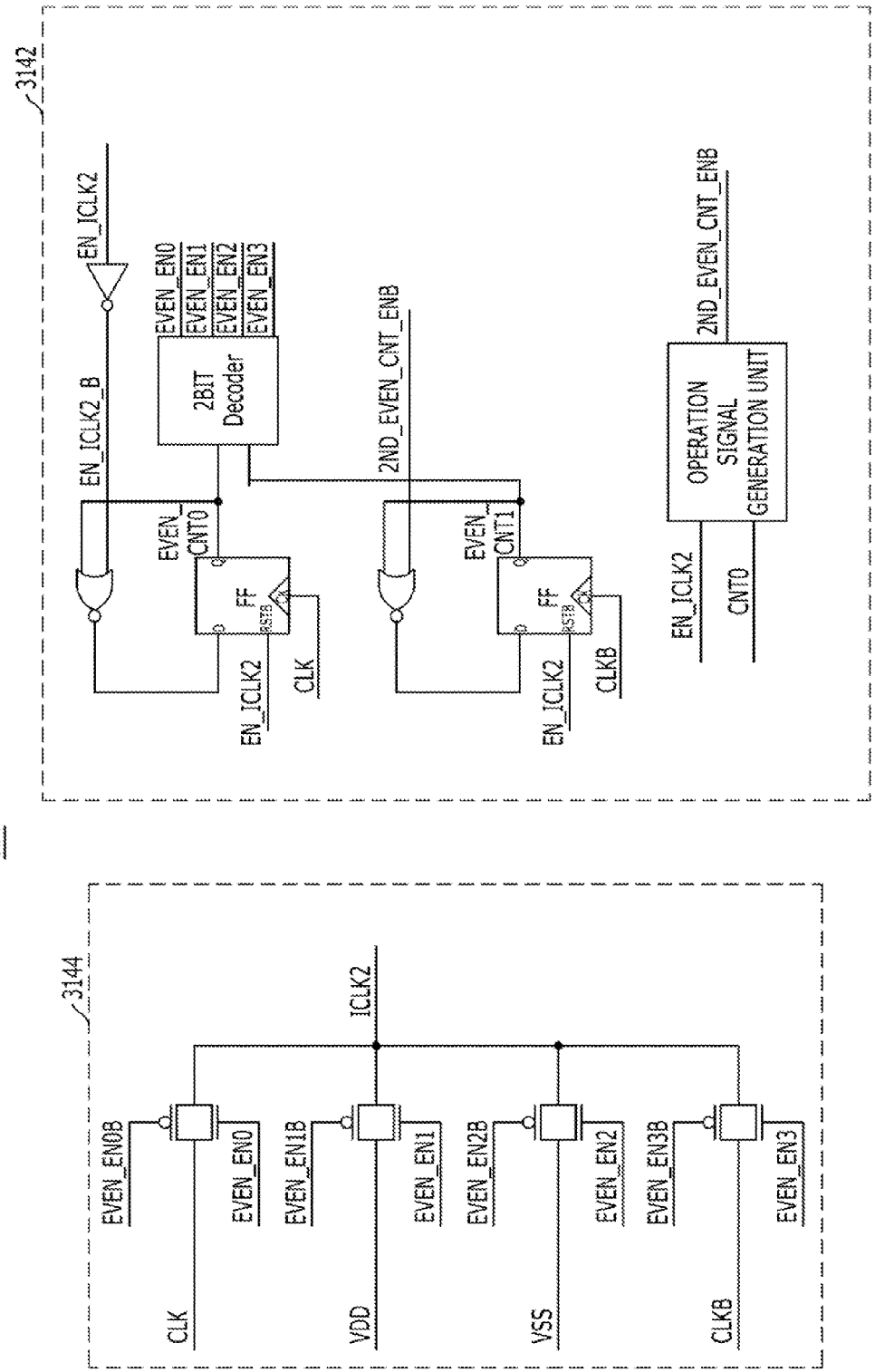
FIG. 6B is a circuit diagram illustrating a second internal clock signal generation unit in accordance with an exemplary embodiment of a clock signal generation unit of the semiconductor memory device using the gear-down mode shown in FIG. 3.

FIG. 6A is a circuit diagram illustrating a first internal clock signal generation unit in accordance with an exemplary embodiment of a clock signal generation unit of the semiconductor memory device using the gear-down mode shown in FIG. 3. FIG. 6B is a circuit diagram illustrating a second internal clock signal generation unit in accordance with an exemplary embodiment of a clock signal generation unit of the semiconductor memory device using the gear-down mode shown in FIG. 3.

Referring to FIGS. 6A and 6B, the clock signal generation unit 310 of the semiconductor memory device using the gear-down mode shown in FIG. 3 in accordance with an exemplary embodiment of the present invention includes a first internal clock signal generation unit 312 and a second internal clock signal generation unit 314. The clock signal generation unit 310 divides an odd number of period and an even number of period of the external clock signal CLK after a power-up operation is performed, and the clock buffering unit 300 buffers the external clock signal CLK.

During the gear-down mode the clock signal generation unit 310 toggles one of the first internal clock signal ICLK1 and the second internal clock signal ICLK2 and disables the other of them in response to the first operation enable signal EN_ICLK1 and the second operation enable signal EN_ICLK2. The clock signal generation unit 310 toggles both, the first internal clock signal ICLK1 and the second internal clock signal ICLK2 in response to the first operation enable signal EN_ICLK1 and the second operation enable signal EN_ICLK2 during the normal operation mode.

Referring to FIG. 6A, the first internal clock signal generation unit 312 divides the frequency of the external clock signal CLK and generates the first internal clock signal ICLK1 corresponding to the odd number of period of the external clock signal CLK in response to the first operation enable signal EN_ICLK1.

The first internal clock signal generation unit 312 includes an odd number operation control unit 3122 and a first internal clock output unit 3124. The odd number operation control unit 3122 is enabled during the activation period of the first operation enable signal EN_ICLK1, and generates first to fourth odd number operation control signals ODD_EN0, ODD_EN1, ODD_EN2 and ODD_EN3, which are sequentially activated at every edge of the external clock signal CLK according to a predetermined sequence, and are not overlapped in the activation period. The first internal clock output unit 3124 selects and outputs the external clock signal CLK, an inverted external clock signal CLKB, a power supply voltage VDD and a ground voltage VSS as the first internal clock signal ICLK1 according to a predetermined sequence in response to the first to fourth odd number operation control signals ODD_EN0, ODD_EN1, ODD_EN2 and ODD_EN3.

Figure 7A:
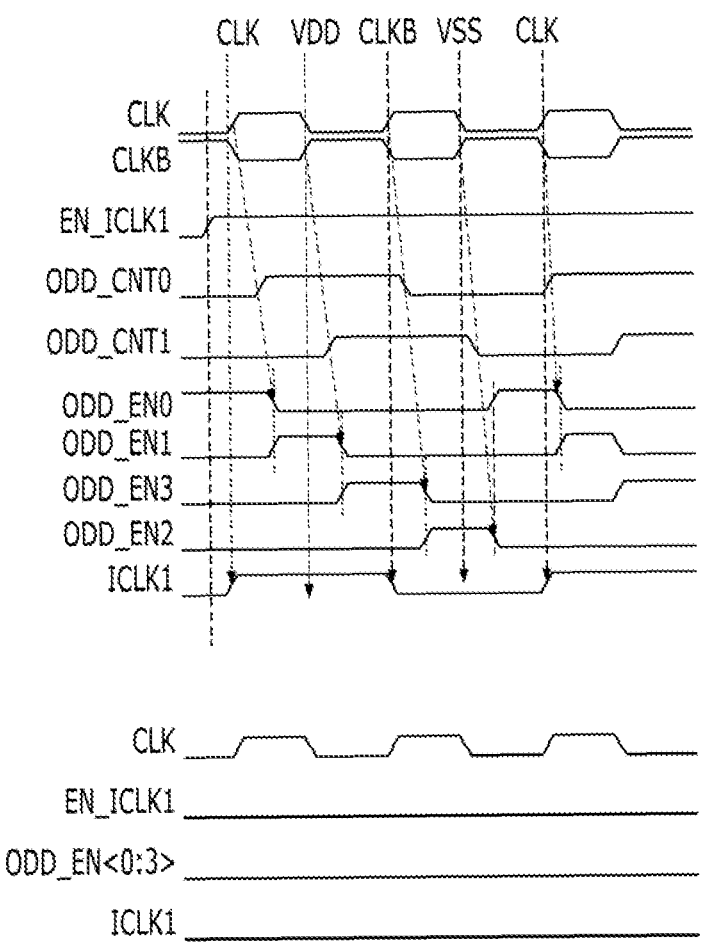
FIG. 7A is a timing diagram illustrating an operation of the first internal clock signal generation unit shown in FIG. 6A.

FIG. 7A is a timing diagram illustrating an operation of the first internal clock signal generation unit shown in FIG. 6A.

Referring to FIG. 7A, an operation of the first internal clock signal generation unit 312 shown in FIG. 6A will be described below.

The first internal clock signal generation unit 312 starts to operate in response to the first operation enable signal EN_ICLK1. At a first step, A $0^{th}$ odd number operation control signal ODD_EN0 is inactivated in response to a rising edge of the external clock signal CLK, and the rising edge of the external clock signal CLK is transferred to a rising edge of the first internal clock ICLK1 and is shifted to the power supply voltage VDD level before a first odd number operation control signal ODD_EN1 is activated.

At a second step, the first odd number operation control signal ODD_EN1 is inactivated in response to the rising edge of an inverted external clock signal CLKB, and the power supply voltage VDD is transferred to the first internal clock signal ICLK1 before a third odd number operation control signal ODD_EN3. The first internal clock signal ICLK1 maintains the power supply voltage VDD level since the first internal clock signal ICLK1 is shifted to the power supply voltage VDD level in response to the rising edge of the external clock signal CLK.

At a third step, the third odd number operation control signal ODD_EN3 is inactivated in response to the rising edge of the clock signal, and a falling edge of the inverted external clock signal CLKB is transferred to a falling edge of the first internal clock signal ICLK1 and is shifted to a ground voltage VSS level before the second odd number operation control signal ODD_EN2 is activated.

At a fourth step, the second odd number of operation control signal ODD_EN2 is inactivated in response to the rising edge of the inverted external clock signal CLKB, and the ground voltage VSS is transferred to the first internal clock signal ICLK1 before the $0^{th}$ odd number operation control signal ODD_EN0 is activated. The first internal clock signal ICLK1 maintains the ground voltage VSS level since the first internal clock signal ICLK1 is shifted to the ground voltage VSS level.

The first internal clock signal ICLK1 having a half frequency of the external clock signal CLK is generated through repeating the first to fourth steps. Such operations are performed when the first operation enable signal EN_ICLK1 is activated to the logic high level. That is, when the first operation enable signal EN_ICLK1 is inactivated, such operations are disabled, and the first internal clock signal ICLK1 is not generated.

Referring to FIG. 6A, The second internal clock signal generation unit 314 divides a frequency of the external clock signal CLK into the half frequency of the external clock signal CLK and generates the second internal clock signal ICLK2 corresponding to an even number of periods of the external clock signal CLK in response to the second operation enable signal EN_ICLK2. The second internal clock signal generation unit 314 includes an even operation control unit 3142 and a second internal clock signal output unit 3144.

The even operation control unit 3142 is enabled during the activation period of the second operation enable signal EN_ICLK2, and generates first to fourth even number operation control signals EVEN_EN0, EVEN_EN1, EVEN_EN2 and EVEN_EN3, which are activated alternately at every edge of the external clock signal CLK according to a predetermined sequence and are not overlapped in the activation period.

The second internal clock signal output unit 3144 selects the external clock signal CLK, the inverted external clock signal CLKB, the power supply voltage VDD and the ground voltage VSS as the second internal clock signal ICLK2 according to the predetermined sequence in response to the first to fourth even number operation control signals EVEN_EN0, EVEN_EN1, EVEN_EN2 and EVEN_EN3.

Figure 7B:
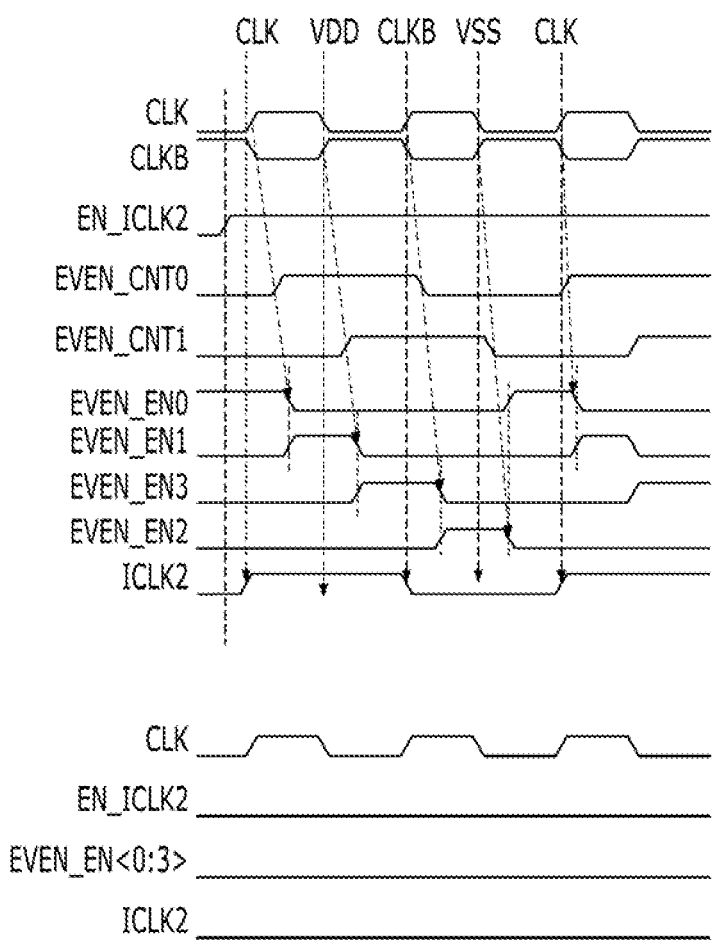
FIG. 7B is a timing diagram illustrating an operation of the second internal clock signal generation unit shown in FIG. 6B.

FIG. 7B is a timing diagram illustrating an operation of the second internal clock signal generation unit shown in FIG. 6B.

Referring to FIG. 7B, an operation of the second internal clock signal generation unit 314 will be described below.

The second internal clock signal generation unit 314 starts to perform an operation when the second operation enable signal EN_ICLK2 is activated.

At a first step, a $0^{th}$ even number operation control signal EVEN_EN0 is inactivated in response to the rising edge of the external clock signal CLK, and the rising edge of the external clock signal CLK is transferred to a rising edge of the second internal clock ICLK2 and is shifted to the power supply voltage VDD level before a first even number operation control signal EVEN_EN1 is activated.

At a second step, the first even number operation control signal EVEN_EN1 is inactivated in response to the rising edge of the inverted external clock signal CLKB, and the power supply voltage VDD is transferred to the second internal clock signal ICLK2 before a third even number operation control signal EVEN_EN3. The second internal clock signal ICLK2 maintains the power supply voltage VDD level since the second internal clock signal ICLK2 is shifted to the power supply voltage VDD level in response to the rising edge of the external clock signal CLK.

At a third step, the third even number operation control signal ODD_EN3 is inactivated in response to the rising edge of the external clock signal CLK, and the falling edge of the inverted external clock signal CLKB is transferred to a falling edge of the second internal clock signal ICLK2 and is shifted to the ground voltage VSS level before the second even number operation control signal EVEN_EN2 is activated.

At a fourth step, the second even number operation control signal EVEN_EN2 is inactivated in response to the rising edge of the inverted external clock signal CLKB, and the ground voltage VSS is transferred to the second internal clock signal ICLK2 before the $0^{th}$ even number operation control signal EVEN_EN0 is activated. The second internal clock signal ICLK2 maintains the ground voltage VSS level since the second internal clock signal ICLK2 is shifted to the ground voltage VSS level.

The second internal clock signal ICLK2 having the half frequency of the external clock signal CLK is generated through repeating the first to fourth steps. Such operations are performed when the second operation enable signal EN_ICLK2 is activated to the logic high level. That is, when the second operation enable signal EN_ICLK2 is inactivated, such operations are disabled, and the second internal clock signal ICLK2 is not generated.

Figure 8A:
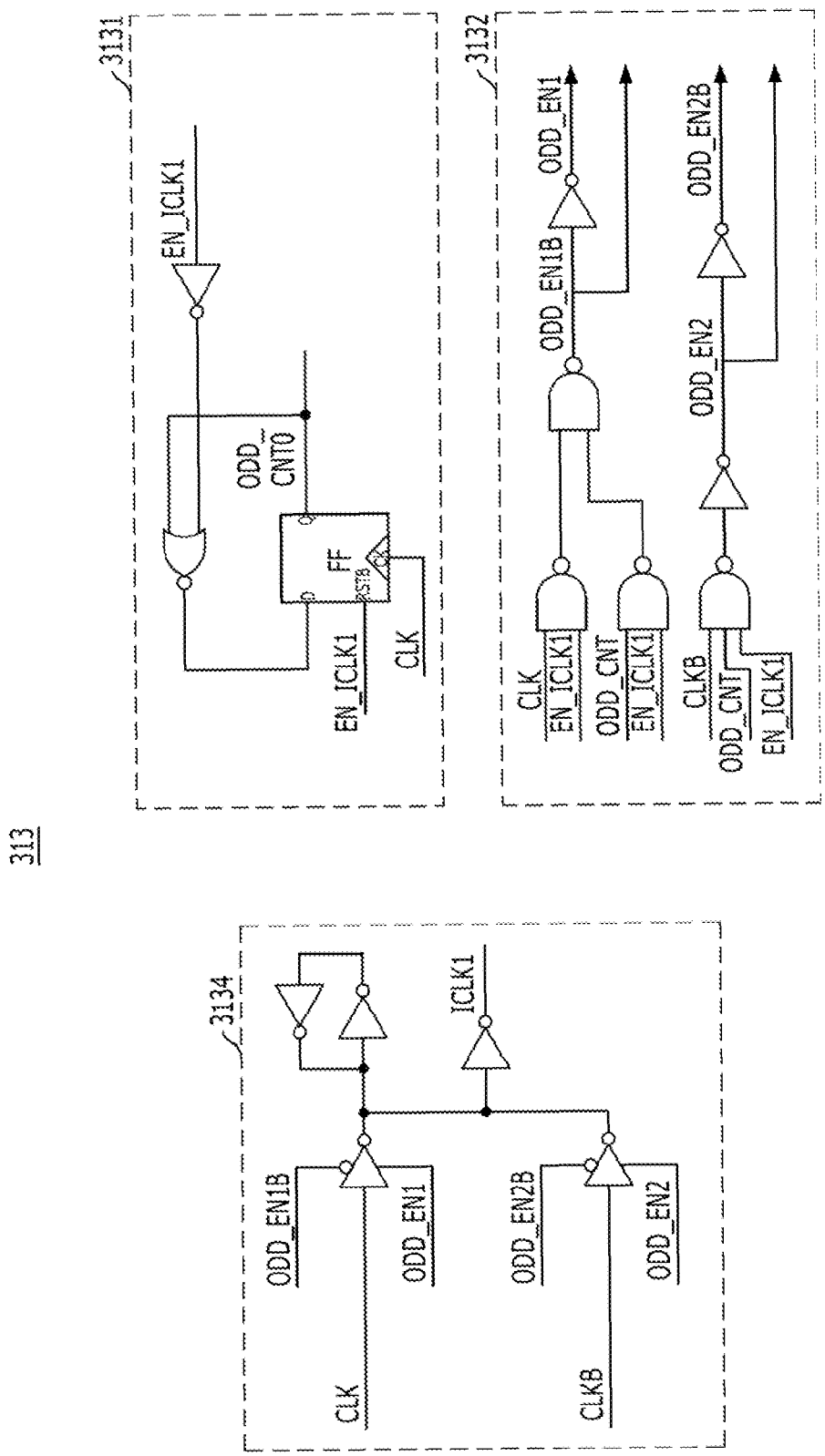
FIG. 8A is a circuit diagram illustrating a first internal clock signal generation unit in accordance with another exemplary embodiment of a clock signal generation unit of the semiconductor memory device using the gear-down mode shown in FIG. 3.
Figure 8B:
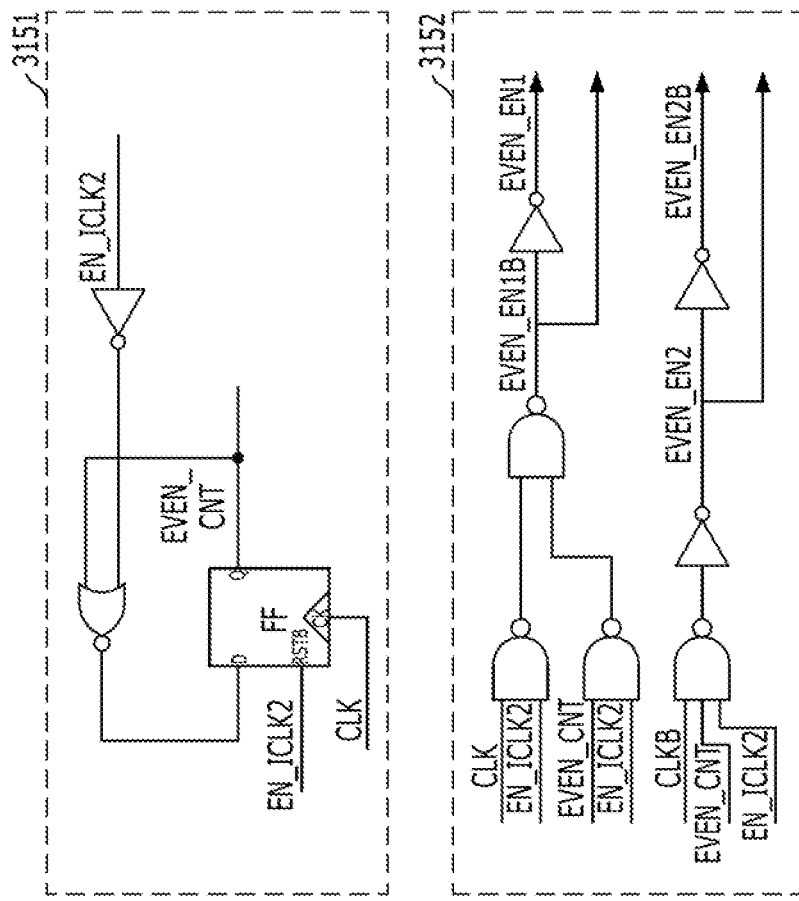
FIG. 8B is a circuit diagram illustrating a second internal clock signal generation unit in accordance with another exemplary embodiment of a clock signal generation unit of the semiconductor memory device using the gear-down mode shown in FIG. 3.

FIG. 8A is a circuit diagram illustrating a first internal clock signal generation unit in accordance with another exemplary embodiment of a clock signal generation unit of the semiconductor memory device using the gear-down mode shown in FIG. 3. FIG. 8B is a circuit diagram illustrating a second internal clock signal generation unit in accordance with another exemplary embodiment of a clock signal generation unit of the semiconductor memory device using the gear-down mode shown in FIG. 3.

Referring to FIGS. 8A and 8B, a clock signal generation unit 310 in accordance with another example of the semiconductor memory device using the gear-down mode shown in FIG. 3 includes a first internal clock signal generation unit 313 and a second internal clock signal generation unit 315. The clock signal generation unit 310 separates the odd number period and the even number period of the external clock signal CLK when the external clock signal CLK is buffered in the clock buffering unit 300 shown FIG. 3 after a power-up operation. The clock signal generation unit 310 toggles one of the first internal clock signal ICLK1 and the second internal clock signal ICLK2 and disables the other of them during the gear-down mode in response to the first operation enable signal EN_ICLK1 and the second operation enable signal EN_ICLK2. The clock signal generation unit 310 toggles both of the first internal clock signal ICLK1 and the second internal clock signal ICLK2 during a normal operation period in response to the first operation enable signal EN_ICLK1 and the second operation enable signal EN_ICLK2.

Referring to FIG. 8A the first internal clock signal generation unit 313 divides the frequency of the external clock signal CLK into the half frequency of the external clock signal CLK, and generates the first internal clock signal ICLK1 corresponding to an odd number period of the external clock signal CLK in response to the first operation enable signal EN_ICLK1. The first internal clock signal generation unit 313 includes an odd number edge counting unit 3131, an odd number operation control unit 3132 and a first internal clock signal output unit 3134.

The odd number edge counting unit 3131 is enabled in response to an activation of the first operation enable signal EN_ICLK1, and generates an odd number counting signal ODD_CNT, of which a logic level is shifted at every rising edge of the external clock signal CLK.

The odd number operation control unit 3132 is enabled in response to the activation of the first operation enable signal EN_ICLK1, generates a first odd number operation control signal ODD_EN1 and an inverted first odd number operation control signal ODD_EN1B by performing a NAND operation of the odd number counting signal ODD_CNT and the external clock signal CLK with the first operation enable signal EN_ICLK1, respectively, using an inverter and NAND gates. The odd number operation control unit 3132 generates a second odd number operation control signal ODD_EN2 and an inverted second odd number operation control signal ODD_EN2B by performing an AND operation of the odd number counting signal ODD_CNT with the inverted external clock signal CLKB using inverters and a NAND gate.

The first internal clock signal output unit 3134 selects and outputs the external clock signal CLK during the activation period of the first odd number operation control signal ODD_EN1 and the inverted external clock signal CLKB during the activation period of the second odd number operation control signal ODD_EN2 as the first internal clock signal ICLK1.

Figure 9A:
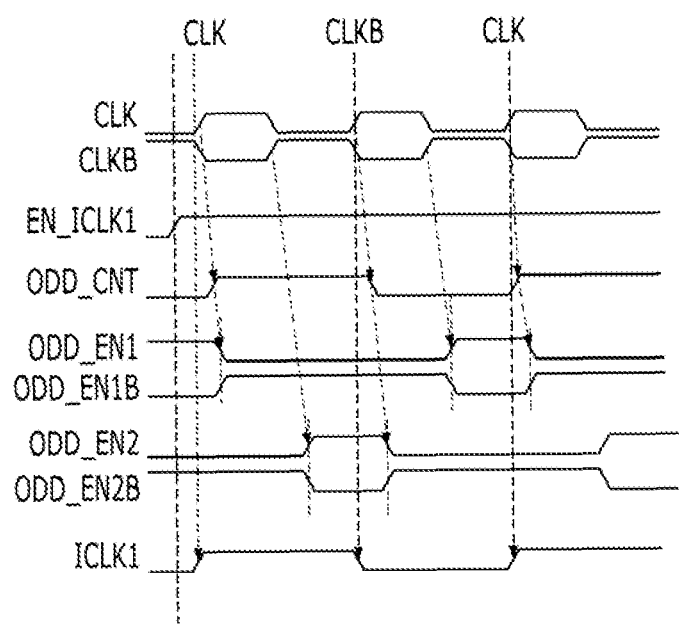
FIG. 9A is a timing diagram illustrating an operation of the internal clock signal generation unit shown in FIG. 8A.
Figure 9A:
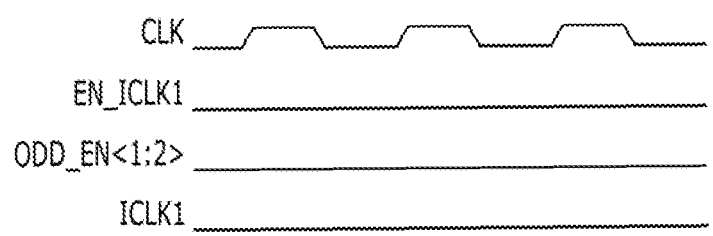

FIG. 9A is a timing diagram illustrating an operation of the first internal clock signal generation unit shown in FIG. 8A.

Referring to FIG. 9A, an operation of the first internal clock signal generation unit 313 will be described below. The first internal clock signal generation unit 313 starts to operate when the first operation enable signal EN_ICLK1 is activated.

At a first step, since the odd number counting signal ODD_CNT is shifted to a logic high level in response to the rising edge of the external clock signal CLK, the rising edge of the external clock signal CLK is transferred to the rising edge of the first internal clock signal ICLK1 and is shifted to the logic high level before the first odd number operation control signal ODD_EN1. Since a shifting time of the odd number counting signal ODD_CNT to the logic high level is later than a shifting time of the inverted external clock signal CLKB to the logic low level, the second odd number operation control signal ODD_EN2 is maintained at the inactivation state.

At a second step, the second odd number operation control signal ODD_EN2 is activated in response to the rising edge of the inverted external clock signal CLKB while the odd number counting signal ODD_CNT is maintained at the logic high level before the rising edge of the clock signal is repeated. Since the rising edge of the inverted external clock signal CLKB is prior to the activation time of the second odd number operation control signal ODD_EN2, the first internal clock signal ICLK1 is maintained at the logic high level.

At a third step, since the odd number of toggling signal ODD_CNT is shifted to the logic low level in response to the rising edge of the external clock signal CLK, the falling edge of the inverted external clock signal CLKB is transferred to the falling edge of the first internal clock signal ICLK1 and is shifted to the logic low level before the second odd number operation control signal ODD_EN2 is inactivated. Since the shifting time of the odd number counting signal ODD_CNT to the logic low level is later than the shifting time of the clock signal to the logic high level, the first odd number operation control signal ODD_EN1 is maintained at the inactivation state.

At a fourth step, the first odd number operation control signal ODD_EN1 is activated in response to the falling edge of the external clock signal CLK while the odd number counting signal ODD_CNT is maintained at the logic low level before the rising edge of the external clock signal CLK is repeated. Since the falling edge of the external clock signal CLK is prior to the activation time of the first odd number operation control signal ODD_EN1 the first internal clock signal ICLK1 is maintained at the logic low level.

The first internal clock signal ICLK1 having a half frequency of the external clock signal CLK is generated through repeating the first to fourth steps. Such operations are performed when the first operation enable signal EN_ICLK1 is activated at the logic high level. That is, when the first operation enable signal EN_ICLK1 is inactivated at the logic low level, all operations are disabled and tine first internal clock signal ICLK1 is not generated.

Referring to FIG. 8B, the second internal clock signal generation unit 315 divides the frequency of the external clock signal CLK into the half frequency of the external clock signal CLK, and generates the second internal clock signal ICLK2 corresponding to an even number period of the external clock signal CLK in response to the second operation enable signal EN_ICLK2. The second internal clock signal generation unit 315 includes an even number edge counting unit 3151, an even number operation control unit 3152 and a second internal clock signal output unit 3154.

The even number edge counting unit 3151 is enabled in response to an activation of the second operation enable signal EN_ICLK2, and generates an even number counting signal EVEN_CNT, of which a logic level is shifted at every rising edge of the external clock signal CLK.

The even number operation control unit 3152 is enabled in response to the activation of the second operation enable signal EN_ICLK2, generates a first even number operation control signal EVEN_EN1 and an inverted first even number operation control signal EVEN_EN1B by performing a NAND operation of the even number counting signal EVEN_CNT and the external clock signal CLK with the second operation enable signal EN_ICLK2, respectively, using an inverter and NAND gates. The even number operation control unit 3152 generates a second even number operation control signal EVEN_EN2 and an inverted second even number operation control signal EVEN_EN2B by performing an AND operation of the even number counting signal EVEN_CNT with the inverted external clock signal CLKB using inverters and a NAND gate.

The second internal clock signal output unit 3154 selects and outputs the external clock signal CLK during the activation period of the first even number operation control signal EVEN_EN1 and the inverted external clock signal CLKB during the activation period of the second even number operation control signal EVEN_EN2 as the second internal clock signal ICLK2.

Figure 9B:
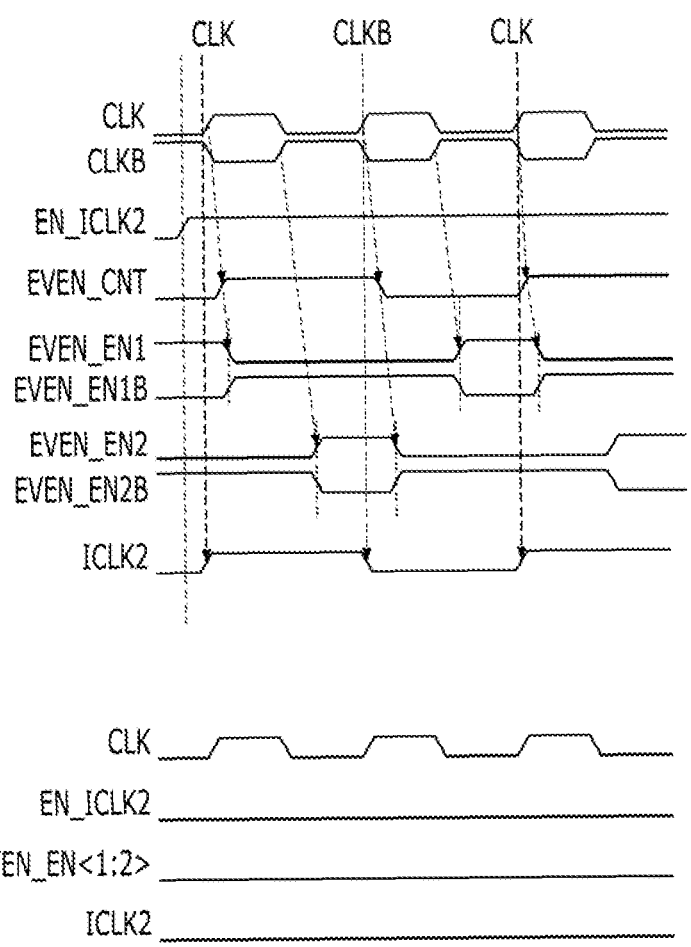
FIG. 9B is a timing diagram illustrating an operation of the second internal clock signal generation unit shown in FIG. 8B.

FIG. 9B is a timing diagram illustrating an operation of the second internal clock signal generation unit shown in FIG. 8B.

Referring to FIG. 9B, an operation of the second internal clock signal generation unit 315 will be described below. The second internal clock signal generation unit 315 starts to operate when the second operation enable signal EN_ICLK2 is activated.

At a first step, since the even number counting signal EVEN_CNT is shifted to a logic high level in response to the rising edge of the external clock signal CLK, the rising edge of the external clock signal CLK is transferred to the rising edge of the second internal clock signal ICLK2 and is shifted to the logic high level before the first even number operation control signal EVEN_EN1. Since a shifting time of the even number counting signal EVEN_CNT to the logic high level is later than a shifting time of the inverted external clock signal CLKB to the logic low level, the second even number operation control signal EVEN_EN2 is maintained at the inactivation state.

At a second step, the second even number operation control signal EVEN_EN2 is activated in response to the rising edge of the inverted external clock signal CLKB while the even number counting signal EVEN_CNT is maintained at the logic high level before the rising edge of the clock signal is repeated. Herein, since the rising edge of the inverted external clock signal CLKB is prior to the activation time of the second even number operation control signal EVEN_EN2, the second internal clock signal ICLK2 is maintained at the logic high level.

At a third step, since the even number of toggling signal EVEN_CNT is shifted to the logic low level in response to the rising edge of the external clock signal CLK, the falling edge of the inverted external clock signal CLKB is transferred to the falling edge of the second internal clock signal ICLK2 and is shifted to the logic low level before the second even number operation control signal EVEN_EN2 is inactivated. Since the shifting time of the even number counting signal EVEN_CNT to the logic low level is later than the shifting time of the clock signal to the logic high level, the first even number operation control signal EVEN_EN1 is maintained at the inactivation state.

At a fourth step, the first even number operation control signal EVEN_EN1 is activated in response to the falling edge of the external clock signal CLK while the even number counting signal EVEN_CNT is maintained at the logic low level before the rising edge of the external clock signal CLK is repeated. Since the falling edge of the external clock signal CLK is prior to the activation time of the first even number operation control signal EVEN_EN1, the second internal clock signal ICLK2 is maintained at the logic low level.

The second internal clock signal ICLK2 having a half frequency of the external clock signal CLK is generated through repeating the first to fourth steps. Such operations are performed when the second operation enable signal EN_ICLK2 is activated at the logic high level. That is, when the second operation enable signal EN_ICLK2 is inactivated at the logic low level, all operations are disabled and the second internal clock signal ICLK2 is not generated.

As described above, in the semiconductor memory device using a gear-down mode in accordance with a third embodiment of the present invention, one of the first input unit 330 and the second input unit 340 is selectively enabled during the gear-down mode, and both of them are enabled during the normal operation mode. Through this operation, the first input unit 330 and the second input unit 340 operate at every two periods of the external clock signal CLK irrespective of the input of the external command signal CMD and the external address signal ADD at every one period (1tck) or every two periods (2tck).

However, only one of the first input unit 330 and the second input unit 340 may be used during the normal operation mode according to an operation environment of the semiconductor memory device. That is, the first input unit 330 or the second input unit 340 may operate independently although the external command signal CMD and the external address signal ADD are provided at every one period (1tck) of the external clock signal CLK. Thus, one of the first input unit 330 and the second input unit 340, operates independently although the external command signal CMD and the external address signal ADD are provided at every one period (1tck). This case is referred to as a high speed operation mode.

Figure 10:
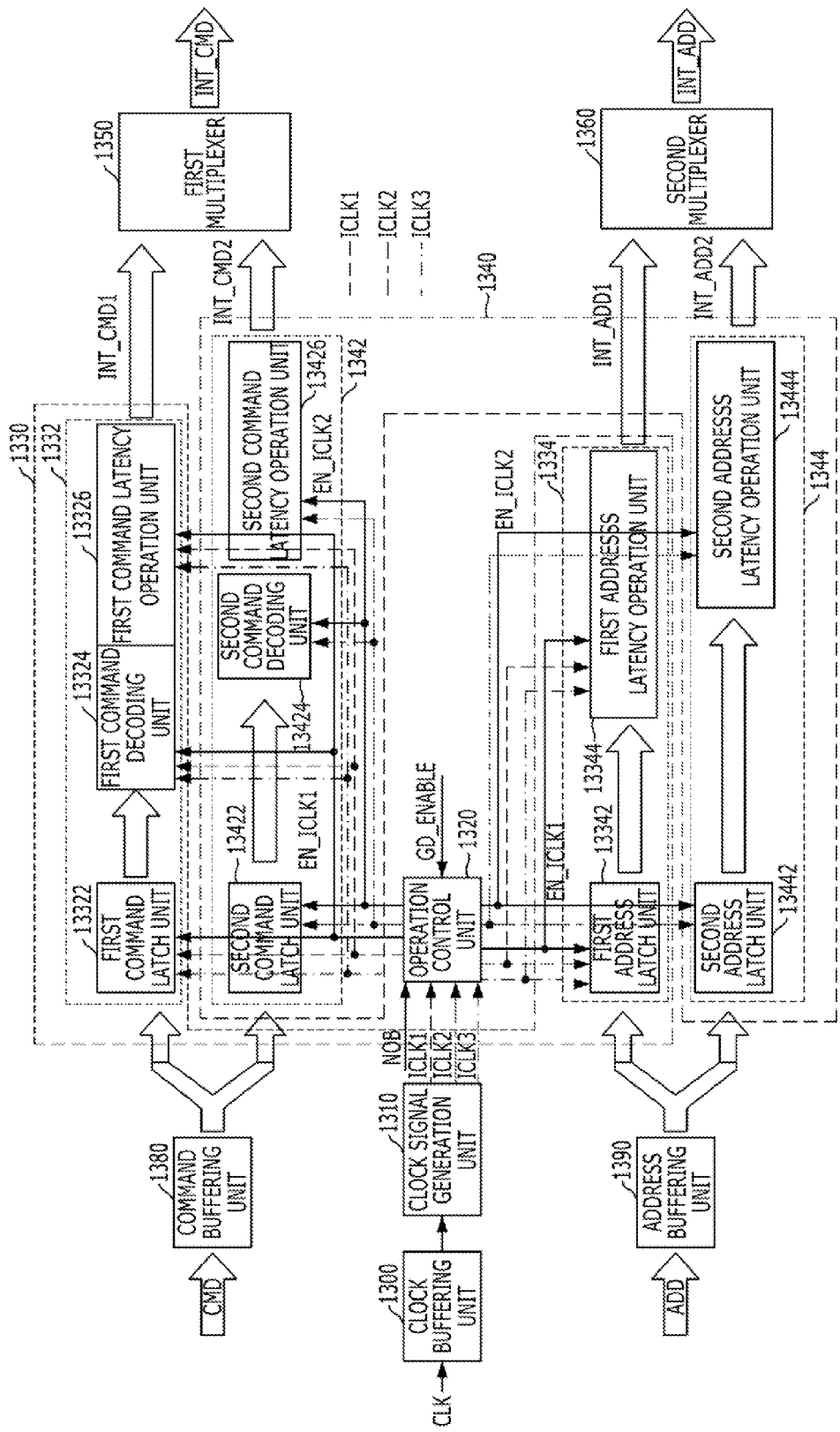
FIG. 10 is a block diagram illustrating a high speed operation mode of the semiconductor memory device using the gear-down mode shown in FIG. 3 in accordance with the third embodiment of the present invention.

FIG. 10 is a block diagram illustrating a high speed operation mode of the semiconductor memory device using the gear-down mode shown in FIG. 3 in accordance with the third embodiment of the present invention.

Referring to FIG. 10, a semiconductor memory device using a high speed operation mode of the gear-down mode shown in FIG. 3 in accordance with the third embodiment of the present invention includes a clock buffering unit 1300, a clock signal generation unit 1310, an operation control unit 1320, a first input unit 1330, a first multiplexer 1350, a second input unit 1340, a second multiplexer 1360, a command buffering unit 1380 and an address buffering unit 1390.

The clock buffering unit 1300 buffers an external clock signal CLK received from the external device (not shown), e.g., a semiconductor memory controller, and transfers an external clock signal CLK to the clock signal generation unit 1310.

The clock signal generation unit 1310 generates a first internal clock signal ICLK1 during a gear-down mode, a second internal clock signal ICLK2 during a normal operation mode, and a third internal clock signal ICLK3 during a high speed operation mode. The first and second internal clock signals ICLK1 and ICLK2 have a half frequency of the external clock signal CLK, which is divided from the external clock signal CLK, respectively. The third internal clock signal ICLK3 has a same frequency as the external clock signal CLK, and is not generated during the gear-down mode and the normal operation mode.

The high speed operation mode represents that a high speed operation mode enable signal HG_ENABLE is activated. That is, if the high speed operation mode enable signal HG_ENABLE is activated using a control signal inputted through a mode register set (MRS) or a predetermined pad, the semiconductor memory device performs a high speed operation mode.

The operation control unit 1320 enables one of the first input unit 1330 and the second input unit 1340, and disables the other of them during the high speed operation mode. That is, only one of the first input unit 1330 and the second input unit 1340 operates during the high speed operation mode. The one of the first input unit 1330 and the second input unit 1340, which is enabled, and the other, which is disabled, are predetermined by a designer. That is, after the selection by the designer, the selection predetermined by the designer is not changed by an operation of the semiconductor memory device since internal configurations of the first input unit 1330 and the second input unit 1340 must be changed to operate in the gear-down mode, the normal operation mode and the high speed operation mode.

Specifically, one of the first input unit 1330 and the second input unit 1340, which is enabled by the operation control unit 1320 during the high speed operation mode, receives the external clock signal CLK and the external address signal ADD in response to the third internal clock signal ICLK3. That is, the external clock signal CLK and the external address signal ADD are received in response to the first internal clock ICLK1 and the second internal clock ICLK2 during the gear-down mode and the normal operation mode, and are received in response to the third internal clock ICLK3 during the high speed operation mode.

As exemplarily shown in FIG. 10, the first input unit 1330 is enabled and the second input unit 1340 is disabled during the high speed operation mode. Thus, the third internal clock signal ICLK3 is provided to the first input unit 1330 and is not provided to the second input unit 1340. Alternatively, if the second input unit 1340 is enabled and the first input unit 1330 is disabled during the high speed operation mode, the third internal clock signal ICLK3 is provided to the second input unit 1340 and is not provided to the first input unit 1330.

Specifically, as shown in FIG. 10, it is presumed that the first input unit 1330 is enabled during the high speed operation mode. During the high speed operation mode, the first input unit 1330 receives and synchronizes the external command signal CMD and the external address signal ADD through the command buffering unit 1380 and the address buffering unit 1390, with the third internal clock signal ICLK3. The first input unit 1330 applies the latency delay, which is changed according to a sort of the external command signal CMD, on the basis of the number of toggling of the third internal clock signal ICLK3 during the high speed operation mode. The first input unit 1330 receives and synchronizes the external command signal CMD and the external address signal ADD through the command buffering unit 1380 and the address buffering unit 1390 with the first internal clock signal ICLK1, during the normal operation mode or the gear-down mode. The first input unit 1330 applies the latency delay, which is changed according to a sort of the external command signal CMD, on the basis of the number of toggling of the first internal clock signal ICLK1, during the normal operation or the gear-down mode.

The first input unit 1330 includes a first command input unit 1332 and a first address input unit 1334. The first command input unit 1332 receives the external command signal CMD and generates an internal command signal INT_CMD in response to the first internal clock signal CLK1, during the normal operation mode or the gear-down mode.

The first command input unit 1332 includes a first command latch unit 13322, a first command decoding unit 13324, and a first command latency operation unit 13326.

The first command latch unit 13322 latches the external command signal CMD in response to the first internal clock signal ICLK1 or the third internal clock signal ICLK3. That is, the first command latch unit 13322 latches the external command signal CMD in response to the first internal clock ICLK1 during the normal operation mode or the gear-down mode, or in response to the third internal clock signal ICLK3 during the high speed operation mode.

The first command decoding unit 13324 decodes the external command signal CMD latched in the first command latch unit 13322, and determines the number of toggling of the first internal clock signal ICLK1 or the third internal clock signal ICLK3 corresponding to a latency delay based on the sort of the external command signal CMD. The latency delay is variable according to the sort of the external command signal CMD. The first command input unit 1332 operates in a first internal clock signal domain region during the normal operation mode or the gear-down operation mode, and operates in a third internal clock signal domain region during the high speed operation mode. Thus, the external command signal CMD latched in the first command latch unit 13322 is outputted as the first internal command signal INT_CMD1 by delaying the external command signal CMD by the latency delay. For this operation, the first command decoding unit 13324 determines the sort of the external command signal CMD. Subsequently, the first command decoding unit 13324 determines the number of toggling of the first internal clock signal ICLK1 or the third internal clock signal ICLK3 corresponding to the latency delay. For reference, the number of the toggling of the first internal clock signal ICLK1 or the third internal clock signal ICLK3 is predetermined and stored in a mode register set (MRS) according to the sort of the external command signal CMD. Thus, if the sort of the external command signal CMD is determined in the first command decoding unit 13324, the number of the toggling of the first internal clock signal ICLK1 or the third internal clock signal ICLK3 may be determined. That is, when it is presumed that the sort of the external command signal CMD decoded in the first command decoding unit 13324 is same, since a frequency of the third internal clock signal ICLK3 is higher than a frequency of the first internal clock signal ICLK1 by two times, the number of toggling of the latency delay in response to the third internal clock signal ICLK3 is larger than the number of toggling of the latency delay in response to the first internal clock signal ICLK1 by two times.

The first command latency operation unit 13326 delays the external command signal CMD latched in the first command latch unit 13322 by the number of toggling of the first internal clock signal ICLK1 corresponding to the latency delay determined in the first command decoding unit 13324, and outputs the first internal command signal INT_CMD1 during the normal operation mode or the gear down-mode.

The first command latency operation unit 13326 delays the external command signal CMD latched in the first command latch unit 13322 by the number of toggling of the third internal clock signal ICLK3 corresponding to the latency delay determined in the first command decoding unit 13324, and outputs the first internal command signal INT_CMD1 during the high speed operation mode.

The first address input unit 1334 receives the external address signal ADD and generates the first internal address INT_ADD1 in response to the first internal clock signal ICLK1 during the normal operation mode or the gear-down mode. The first address input unit 1334 includes a first address latch unit 13342 and a first address latency operation unit 13344.

The first address latch unit 13342 latches the external address signal ADD in response to the first internal clock signal ICLK1 or the third internal clock signal ICLK3 during the high speed operation mode. That is the first address latch unit 13343 latches the third internal clock signal ICLK3 in response to the first internal clock signal ICLK1 during the normal operation mode or the gear-down mode, and the third internal clock signal ICLK3 during the high speed operation mode.

The first address latency operation unit 13344 delays the external address signal ADD latched in the first address latch unit 13342 by the number of toggling of the first internal clock signal ICLK1 corresponding to the latency delay determined in the first command decoding unit 13324, and outputs the first internal address signal INT_ADD1 during the normal operation mode or the gear-down mode.

The first address latency operation unit 13344 delays the external address signal ADD latched in the first address latch unit 13342 by the number of toggling of the third internal clock signal ICLK3 corresponding to the latency delay determined in the first command decoding unit 13324, and outputs the first internal address signal INT_ADD1 during the high speed operation mode.

The second input unit 1340 receives and synchronizes the external command signal CMD and the external address signal ADD through the command buffering unit 1380 and the address buffering unit 1390 with the third internal clock signal ICLK3 during the high speed operation mode. A latency delay, which is variable according to the sort of the external command signal CMD, is applied based on the number of toggling of the third internal clock signal ICLK3. The second input unit 1340 receives and synchronizes the external command signal CMD and the external address signal ADD through the command buffering unit 1380 and the address buffering unit 1390 with the second internal clock signal ICLK2 during normal operation mode or the gear-down mode. The latency delay, which is variable according to the sort of the external command signal CMD, is applied based on the number of toggling of the second internal clock signal ICLK2.

The second input unit 1340 includes a second command input unit 1342 and a second address input unit 1344.

The second command input unit 1342 receives the external command signal CMD and generates a second internal command signal INT_CMD2 in response to the second internal clock signal ICLK2 during the normal operation mode or the gear-down mode. The second command input unit 1342 includes a second command latch unit 13422, a second decoding unit 13424 and a second command latency operation unit 13426.

The second command input unit 13422 latches the external command signal CMD in response to the second internal clock signal ICLK2 or the third internal clock signal ICLK3 according to the entrance of the high speed operation mode. That is, the second command input unit 13422 latches the external command signal CMD in response to the second internal clock signal ICLK2 during the normal operation or the gear-down mode, and in response to the third internal clock signal ICLK3 during the high speed operation mode.

The second command decoding unit 13424 decodes the external command signal CMD latched in the second command latch unit 13422, and determines the sort of the external command signal CMD. The second command decoding unit 13424 determines the number of toggling of the second internal clock signal ICLK2 or the third internal clock signal ICLK3 for indicating the latency delay according to the sort of the external command signal CMD. The latency delay is variable according to the sort of the external command signal CMD. The second command input unit 1342 operates in a second internal clock signal domain region during the normal operation mode or the gear-down mode, and in response a third internal clock signal domain region during the high speed operation mode. Thus, the external command signal CMD latched in the second command latch unit 13422 is outputted as the second internal command signal INT_CMD2 by delaying the external command signal CMD by the latency delay. The second command decoding unit 13424 determines the sort of the external command signal CMD and the number of toggling of the second internal clock signal ICLK2 or the third internal clock signal ICLK3 corresponding to the latency delay. For reference, the number of toggling of the second internal clock signal ICLK2 or the third internal clock signal ICLK3 is predetermined and stored in the mode register set (MRS) according to the sort of the external command signal CMD. Thus, if the sort of the external command signal CMD is determined in the second command decoding unit 13424, the number of toggling of the second internal clock signal ICLK2 or the third internal clock signal ICLK3 may be determined. That is, if it is presumed that the sort of the external command signal CMD decoded in the second command decoding unit 13424 is same, since a frequency of the third internal clock signal ICLK3 is higher than a frequency of the second internal clock signal ICLK2 by two times, the number of toggling of the latency delay in response to the third internal clock ICLK3 during the high speed operation mode is larger than the number of toggling of the latency delay in response to the second internal clock ICLK2 during the normal operation mode or the gear-down mode.

The second command latency operation unit 13426 delays the external command signal CMD latched in the second command latch unit 13422 by the number of toggling of the second internal clock signal ICLK2 corresponding to the latency delay determined in the second command decoding unit 13424, and outputs the second internal command signal INT_CMD2 during the normal operation mode or the gear-down mode. The second command latency operation unit 13426 delays the external command signal CMD latched in the second command latch unit 13422 by the number of toggling of the third internal clock signal ICLK3 corresponding to the latency delay determined in the second command decoding unit 13424, and outputs the second internal command signal INT_CMD2 during the high speed operation mode.

The second address input unit 1344 receives the external address signal ADD and generates the second internal address INT_ADD2 in response to the second internal clock signal ICLK2 during the normal operation mode or the gear-down mode. The second address input unit 1344 includes a second address latch unit 13442 and a second address latency operation unit 13444. The second address latch unit 13442 latches the external address signal ADD in response to the second internal clock signal ICLK2 or the third internal clock signal ICLK3 according to the entrance of the high speed operation mode. That is, the second address latch unit 13442 latches the external address signal ADD in response to the second internal clock signal ICLK2 during the normal operation mode or the gear-down mode, and in response to the third internal clock signal ICLK3 during the high speed operation mode.

The second address latency operation unit 13444 delays the external address signal ADD latched in the second address latch unit 13442 by the number of toggling of the second internal clock signal ICLK2 corresponding to the latency delay determined in the second command decoding unit 13424, and outputs the second internal address signal INT_ADD2 during the normal operation mode or the gear-down mode. The second address latency operation unit 13444 delays the external address signal ADD latched in the second address latch unit 13442 by the number of toggling of the third internal clock signal ICLK2 corresponding to the latency delay determined in the second command decoding unit 13424, and outputs the second internal address signal INT_ADD2 during the high speed operation mode.

The first multiplexer 1350 receives the first internal command signal INT_CMD1 and the second internal command signal INT_CMD2, and selectively outputs the internal command signal INT_CMD as the first internal command signal INT_CMD1 or the second internal command signal INT_CMD2.

The second multiplexer 1360 receives the first internal address signal INT_ADD1 and the second internal address signal INT_ADD2, and selectively outputs the internal address signal INT_ADD as the first internal address signal INT_ADD1 or the second internal address signal INT_ADD2.

The command buffering unit 1380 buffers and transmits the external command signal CMD to the first command input unit 1332 of the first input unit 1330 and the second command input unit 1342 of the second input unit 1340. The address buffering unit 1390 buffers and transmits the external address signal ADD to the first address input unit 1334 of the first input unit 1330 and the second address input unit 1344 of the second input unit 1340.

As described above with reference to FIG. 10, the high speed operation mode of the semiconductor memory device is applied to the semiconductor memory device using the gear-down mode shown in FIG. 3 in accordance with the third embodiment of the present invention. The high speed operation mode of the semiconductor memory device may be applied to the semiconductor memory devices using the gear-down mode shown in FIG. 1 in accordance with the first embodiment of the present invention and the gear-down mode shown in FIG. 2 in accordance with the second embodiment of the present invention.

While the present invention has been described with respect to the specific embodiments, it will be apparent to those skilled in the art that various changes and modifications may be made without departing from the spirit and scope of the invention as defined in the following claims.

For example, a location and a sort of logic gates and transistors may be implemented differently according to the polarity of an input signal.

What is claimed is:

1. A semiconductor memory device, comprising:
   a clock signal generation unit for dividing an external clock signal to generate a first internal clock signal corresponding to odd number periods of the external clock signal and a second internal clock corresponding to even number periods;
   a first input unit for receiving an external command signal and an external address signal in response to the first internal clock signal;

a second input unit for receiving the external command signal and the external address signal in response to the second internal clock signal; and an operation control unit for enabling one of the first input unit and the second input unit and disabling the other of the first input unit and the second input unit, during a gear-down mode.

2. The semiconductor memory device of claim 1, wherein the operation control unit enables the first input unit and the second input unit during a normal operation mode.

3. The semiconductor memory device of claim 2, wherein the clock signal generation unit generates a third internal clock signal having a same frequency as the external clock signal during a high speed operation mode, the operation control unit enables one of the first input unit and the second input unit and disables the other of the first input unit and the second input unit during the high speed operation mode, and the one of the first input unit and the second input unit, which is enabled by the operation control unit during the high speed operation mode, receives the external clock signal and the external address signal in response to a third internal clock signal.

4. The semiconductor memory device of claim 3, wherein when the first input unit is enabled during the high speed operation mode, the first input unit receives the external command signal and the external address signal, synchronizes the external command signal and the external address signal based on the third internal clock signal, and applies a latency delay having a variable length according to a sort of the external command signal on a basis of a number of toggling of the third internal clock signal to the external command signal and the external address signal, and when the first input unit is enabled during the normal operation mode or the gear-down mode, the first input unit receives the external command signal and the external address signal, synchronizes the external command signal and the external address signal based on the first internal clock, and applies the latency delay on a basis of a number of toggling of the first internal clock signal to the external command signal and the external address signal.

5. The semiconductor memory device of claim 4, wherein when the second input unit is enabled during the high speed operation mode, the second input unit receives the external command signal and the external address signal, synchronizes the external command signal and the external address signal with the third internal clock signal, and applies a latency delay on a basis of a number of toggling of the third internal clock signal to the external command signal and the external address signal, and when the second input unit is enabled during the normal operation mode or the gear-down mode, the second input unit receives the external command signal and the external address signal, synchronizes the external command signal and the external address signal with the second internal clock, and applies the latency delay on a basis of a number of toggling of the second internal clock signal.

6. The semiconductor memory device of claim 5, wherein the first input unit comprises:

a first command latch unit suitable for latching the external command signal in response to the first internal clock signal or the third internal clock depending on the mode;

a first address latch unit suitable for latching the external address signal in response to the first internal clock signal or the third internal clock signal depending on the mode;

a first command decoding unit suitable for decoding the external command signal latched in the first command latch unit to determine the sort of the external command signal, and determining a number of toggling of the first internal clock signal or the third internal clock signal corresponding to the latency delay based on a determined result;

a first command latency operation unit suitable for delaying the external command signal latched in the first command latch unit by the number of toggling of the first internal clock signal and generating the internal command signal in response to the first internal clock signal or the third internal clock signal; and a first address latency operation unit suitable for delaying the external address signal latched in the first address latch unit by the number of toggling of the first internal clock signal corresponding to the latency delay determined in the first command decoding unit, and outputting the first internal address signal in response to the first internal clock signal or the third internal clock signal.

7. The semiconductor memory device of claim 5, wherein the second input unit comprises:

a second command latch unit suitable for latching the external command signal in response to the second internal clock signal or the third internal clock depending on the mode;

a second address latch unit suitable for latching the external address signal in response to the second internal clock signal or the third internal clock signal depending on the mode;

a second command decoding unit suitable for decoding the external command signal latched in the second command latch unit to determine the sort of the external command signal, and determining a number of toggling of the second internal clock signal or the third internal clock signal corresponding to the latency delay based on a determined result;

a second command latency operation unit suitable for delaying the external command signal latched in the second command latch unit by the number of toggling of the second internal clock signal and generating the internal command signal in response to the second internal clock signal or the third internal clock signal; and a second address latency operation unit suitable for delaying the external address signal latched in the second address latch unit by the number of toggling of the second internal clock signal corresponding to the latency delay determined in the second command decoding unit, and outputting the second internal address signal.

8. The semiconductor memory device of claim 7, wherein the number of toggling of the first command decoding unit and the second command decoding unit, which is determined in response to the third internal clock signal during the high speed operation mode, is larger than the number of toggling of the first command decoding unit and the second command decoding unit, which is determined in response to the first internal clock signal and the second internal clock signal during the normal operation mode or the gear-down mode by two times.

9. The semiconductor memory device of claim 3, wherein the external command signal and the external address signal are received at every two periods of the external clock signal during the gear-down mode, and the external command signal and the external address signal are received at every one period of the external clock signal during the high speed operation mode and the normal operation mode.

10. The semiconductor memory device of claim 1, wherein the operation control unit comprises:

an operation enable signal generation unit suitable for activating one of a first operation enable signal and a second operation enable signal and inactivating the other of first operation enable signal and the second operation enable signal in response to a clock selection signal, the first internal clock signal and the second internal clock signal, during the gear-down mode;

a first clock selection unit suitable for fixing the first internal clock signal to a predetermined logic level in response to the first operation enable signal; and a second clock selection unit suitable for fixing the second internal clock signal to the predetermined logic level in response to the second operation enable signal.

11. The semiconductor memory device of claim 10, wherein the operation enable signal generation unit comprises:

a first activation determination unit suitable for latching the clock selection signal based on the first internal clock signal and determining an activation state of the first operation enable signal, during the gear-down mode; and a second activation determination unit suitable for latching the clock selection signal based on the second internal clock signal and determining an activation state of the second operation enable signal, during the gear-down mode.

12. The semiconductor memory device of claim 11, wherein the first activation determination unit maintains the activation state of the first operation enable signal during the normal operation mode, and the second activation determination unit maintains the activation state of the second operation enable signal during the normal operation mode.

13. The semiconductor memory device of claim 12, wherein the first input unit receives the external command signal and the external address signal in response to the first internal clock signal during the activation state of the first operation enable signal, and is disabled during the inactivation state of the first operation enable signal.

14. The semiconductor memory device of claim 13, wherein the second input unit receives the external command signal and the external address signal in response to the second internal clock signal during the activation state of the second operation enable signal, and is disabled during the inactivation state of the second operation enable signal.

15. The semiconductor memory device of claim 12, wherein the clock generation unit separates odd number periods and even number periods of the external clock signal in response to a buffering of the external clock signal after a power-up signal, toggles one of the first internal clock signal and the second clock signal, disables the other of the first internal clock signal and the second clock signal during the gear-down mode in response to the first operation enable signal and the second operation enable signal, and toggles both of the first internal clock signal and the second internal clock signal during the normal operation mode.

16. The semiconductor memory device of claim 15, wherein the clock generation unit comprises:

a first internal clock signal generation unit suitable for dividing a frequency of the external clock signal into a half frequency of the external clock signal, and generating the first internal clock signal corresponding to the odd number periods of the external clock signal, and operating in response to the first operation enable signal; and a second internal clock signal generation unit suitable for dividing the frequency of the external clock signal into the half frequency of the external clock signal, and generating the second internal clock signal corresponding to the even number periods of the external clock signal, and operating in response to the second operation enable signal.

17. The semiconductor memory device of claim 16, wherein the first internal clock signal generation unit comprises:

an odd number operation control unit, which is enabled during an activation period of the first operation enable signal, suitable for generating first to fourth odd number operation control signals, which are sequentially and alternately activated at every edge of the external clock signal and are not overlapped in an activation period; and a first internal clock signal output unit suitable for selecting the external clock, an inverted external clock signal, a power supply voltage and a ground voltage, respectively, according to a predetermined sequence, and generating the first internal clock signal in response to the first to fourth odd number operation control signals.

18. The semiconductor memory device of claim 17, wherein the second internal clock signal generation unit comprises:

an odd number operation control unit, which is enabled during an activation period of the second operation enable signal, suitable for generating first to fourth even number operation control signals, which are sequentially and alternately activated at every edge of the external clock signal and are not overlapped in an activation period; and a second internal clock signal output unit suitable for selecting the external clock, an inverted external clock signal, a power supply voltage and a ground voltage, respectively, according to a predetermined sequence, and generating the second internal clock signal in response to the first to fourth even number operation control signals.

19. The semiconductor memory device of claim 16, wherein the first internal clock signal generation unit comprises:

an odd number edge counting unit, which is enabled during the activation period of the first operation enable signal, suitable for generating an odd number counting signal of which a logic level is shifted at an every first edge of the external clock signal;

an odd number operation control unit, which is enabled during the activation period of the first operation enable signal, suitable for generating a first odd number operation control signal by performing a NAND operation of the external clock signal and the odd number counting signal, and generating a second odd number operation control signal by performing an AND operation of the inverted external clock signal and the odd number counting signal; and a first internal clock signal output unit suitable for generating the first internal clock signal by selecting the external clock signal during the activation period of the first odd number operation control signal and the inverted external clock signal during the activation period of he second odd number operation control signal.

20. The semiconductor memory device of claim 16, wherein the second internal clock signal generation unit comprises:

an even number edge counting unit, which is enabled during the activation period of the second operation enable signal, suitable for generating an even number counting signal of which a logic level is shifted at an every first edge of the external clock signal;

an even number operation control unit, which is enabled during the activation period of the second operation enable signal, suitable for generating a first even number operation control signal by performing a NAND operation of the external clock signal and the even number counting signal, and generating a second even number operation control signal by performing an AND operation of the inverted external clock signal and the even number counting signal; and a second internal clock signal output unit suitable for generating the second internal clock signal by selecting the external clock signal during the activation period of the first even number operation control signal and the inverted external clock signal during the activation period of the second even number operation control signal.

* * * * *